United States Patent
Inubushi et al.

(10) Patent No.: US 11,769,523 B2
(45) Date of Patent: *Sep. 26, 2023

(54) MAGNETORESISTANCE EFFECT ELEMENT AND HEUSLER ALLOY

(71) Applicant: TDK CORPORATION, Tokyo (JP)

(72) Inventors: Kazuumi Inubushi, Tokyo (JP);
Katsuyuki Nakada, Tokyo (JP);
Tetsuya Uemura, Hokkaido (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/853,429

(22) Filed: Jun. 29, 2022

(65) Prior Publication Data

US 2022/0328067 A1     Oct. 13, 2022

Related U.S. Application Data

(62) Division of application No. 16/984,381, filed on Aug. 4, 2020, now Pat. No. 11,410,689.

(30) Foreign Application Priority Data

Aug. 8, 2019    (JP) .................. 2019-146630
Mar. 10, 2020   (JP) .................. 2020-041353

(51) Int. Cl.
*G11B 5/39*      (2006.01)
*G11C 11/16*     (2006.01)
(Continued)

(52) U.S. Cl.
CPC .......... *G11B 5/3903* (2013.01); *G01R 33/093* (2013.01); *G11B 5/3929* (2013.01);
(Continued)

(58) Field of Classification Search
None
See application file for complete search history.

(56) References Cited

U.S. PATENT DOCUMENTS 9,336,937 B2   5/2016  Takahashi et al.
9,564,581 B1   2/2017  Choi et al.
(Continued)

FOREIGN PATENT DOCUMENTS

JP    6137577 B2      5/2017
JP    2019-062060 A   4/2019

OTHER PUBLICATIONS

Jung et al., "Enhancement of magnetoresistance by inserting thin NiAl layers at the interfaces in Co2FeGa0.5Ge0.5/Ag/CO2FeGa0.5Ge0.5 current-perpendicular-to-plane pseudo spin valves," Applied Physics Letters, 2016, vol. 108, pp. 102408-1-102408-5.
(Continued)

*Primary Examiner* — Kevin M Bernatz
(74) *Attorney, Agent, or Firm* — Oliff PLC

(57) ABSTRACT

A magnetoresistance effect element includes a first ferromagnetic layer, a second ferromagnetic layer, and a non-magnetic layer positioned between the first ferromagnetic layer and the second ferromagnetic layer, and at least one of the first ferromagnetic layer and the second ferromagnetic layer is a Heusler alloy represented by the following General Formula (1):

$$Co_2Fe_\alpha X_\beta \qquad (1)$$

(in Formula (1), X represents one or more elements selected from the group consisting of Mn, Cr, Si, Al, Ga and Ge, and $\alpha$ and $\beta$ represent numbers that satisfy $2.3 \leq \alpha+\beta$, $\alpha<\beta$, and $0.5<\alpha<1.9$).

25 Claims, 13 Drawing Sheets

(51) Int. Cl.
  *H01F 10/193* (2006.01)
  *H01F 10/32* (2006.01)
  *G01R 33/09* (2006.01)
  *H10B 61/00* (2023.01)
  *H10N 50/85* (2023.01)

(52) U.S. Cl.
  CPC ........ *G11C 11/161* (2013.01); *H01F 10/1936* (2013.01); *H01F 10/325* (2013.01); *H10B 61/00* (2023.02); *H10N 50/85* (2023.02); *G11B 2005/3996* (2013.01)

(56) References Cited

U.S. PATENT DOCUMENTS

| | | | |
|---|---|---|---|
| 9,899,044 B2* | 2/2018 | Furubayashi | ............ G11B 5/39 |
| 11,004,465 B2 | 5/2021 | Kasai et al. | |
| 11,107,908 B2 | 8/2021 | Manipatruni et al. | |
| 11,410,689 B2* | 8/2022 | Inubushi | ................. H01L 43/10 |
| 11,581,365 B2* | 2/2023 | Nakada | .............. G01R 33/0052 |
| 2006/0215330 A1 | 9/2006 | Ide et al. | |
| 2008/0268290 A1 | 10/2008 | Carey et al. | |
| 2009/0168269 A1 | 7/2009 | Carey et al. | |
| 2010/0103565 A1 | 4/2010 | Lou | |
| 2011/0043950 A1 | 2/2011 | Carey et al. | |
| 2011/0089940 A1 | 4/2011 | Carey et al. | |
| 2013/0302649 A1 | 11/2013 | Takahashi et al. | |
| 2016/0019917 A1 | 1/2016 | Du et al. | |
| 2018/0243691 A1 | 8/2018 | Mueller et al. | |
| 2018/0254409 A1 | 9/2018 | Nakada et al. | |
| 2018/0342668 A1 | 11/2018 | Inubushi et al. | |
| 2019/0094315 A1 | 3/2019 | Inubushi et al. | |
| 2020/0266336 A1 | 8/2020 | Nakada et al. | |
| 2021/0043682 A1* | 2/2021 | Nakada | ............... H01F 10/1936 |

OTHER PUBLICATIONS

Masayuki Takagishi et al. "Magnetoresistance Ratio and Resistance Area Design of CPP-MR Film for 2-5 Tb/in2 Read Sensors". IEEE Transactions on Magnetics, vol. 46, No. 6, Jun. 2010, pp. 2086-2089.

Hari S. Goripati et al. "Bi-Quadratic Interlayer Exchange Coupling in Co2MnSi/Ag/Co2MnSi Pseudo Spin-Valve". Journal of Applied Physics, vol. 110, 2011, pp. 123914-1 through 123914-7.

T. Furubayashi et al. "Structure and Transport Properties of Current-Perpendicular-to-Plane Spin Valves Using Co2FeAl0.5Si0.5 and Co2MnSi Heusler Alloy Electrodes". Journal of Applied Physics, vol. 107, 2010, pp. 113917-1 through 113917-7.

Taku Iwase et al. "Large Interface Spin-Asymmetry and Magnetoresistance in Fully Epitaxial Co2MnSi/Ag/Co2MnSi Current-Perpendicular-to-Plane Magnetoresistive Devices". Applied Physics Express, vol. 2, 2009, vol. 063003-1 through 063003-3.

Dec. 21, 2020 Search Report issued in European Patent Application No. 20189919.2.

Nov. 4, 2021 Office Action issued in U.S. Appl. No. 16/984,381.

Apr. 4, 2022 Notice of Allowance Issued in U.S. Appl. No. 16/984,381.

Translation of Apr. 27, 2023 Office Action issued in Chinese Application No. 202010777761.3.

* cited by examiner

MAGNETORESISTANCE EFFECT ELEMENT AND HEUSLER ALLOY

CROSS REFERENCE TO RELATED APPLICATION

This application is a divisional application of U.S. application Ser. No. 16/984,381, filed Aug. 4, 2020, now U.S. Pat. No. 11,410,689, issued Aug. 9, 2022, the contents of which are incorporated herein by reference.

BACKGROUND OF THE INVENTION

Field of the Invention

The disclosure relates to a magnetoresistance effect element and a Heusler alloy that can be beneficially used for an element or device using magnetism such as a magnetoresistance effect element.

Priority is claimed on Japanese Patent Application No. 2019-146630, filed Aug. 8, 2019, and Japanese Patent Application No. 2020-041353, filed Mar. 10, 2020, the contents of which are incorporated herein by reference.

Description of Related Art

A magnetoresistance effect element is an element that changes a resistance value in a lamination direction due to a magnetoresistance effect. The magnetoresistance effect element includes two ferromagnetic layers and a non-magnetic layer inserted therebetween. A magnetoresistance effect element in which a conductor is used for a non-magnetic layer is called a giant magnetic resistance (GMR) element, and a magnetoresistance effect element in which an insulating layer (tunnel barrier layer, barrier layer) is used as a non-magnetic layer is called a tunnel magnetic resistance (TMR) element.

Among GMR elements, a current-perpendicular-to-plane-giant magnetic resistance element (CPP-GMR element) that allows a current to flow in a direction perpendicular to a film surface of the element has been focused upon as a next-generation hard disk head. In the CPP-GMR, in order to improve the MR ratio (Magnetoresistance ratio), a Heusler alloy is widely used for the ferromagnetic layer.

Non-Patent Document 1 discloses a CPP-GMR element having a configuration in which a $Co_2FeGa_{0.5}Ge_{0.5}$ alloy, which is a Heusler alloy, is used as a material of a ferromagnetic layer, Ag is used as a material of a non-magnetic layer, and a NiAl layer is inserted between the ferromagnetic layer and the non-magnetic layer. Non-Patent Document 1 discloses a CPP-GMR element having an MR ratio of 77% and an RA (Resistance Area product) of 33.4 $m\Omega \cdot \mu m^2$.

In Non-Patent Document 2, conditions of a CPP-GMR element that can be used as a magnetic head of a hard disk having a recording density of 2 $Tbit/in^2$ are described. In Non-Patent Document 2, a graph showing the relationship between the MR ratio and the RA of the CPP-GMR when the critical current density Jc due to spin-transfer torque is set to $2.5 \times 10^7$ $A/cm^2$, $5.0 \times 10^7$ $A/cm^2$, and $1.0 \times 10^8$ $A/cm^2$ is shown.

Non-Patent Documents

[Non-Patent Document 1] Appl. Phys. Lett. 108, 102408 (2016)
[Non-Patent Document 2] IEEE TRANSACTIONS ON MAGNETICS, VOL. 46, NO. 6, JUNE 2010, FIG. 5

SUMMARY OF THE INVENTION

With the demand for lower voltage and lower power consumption of hard disks in recent years, there has been a demand for lower power consumption for hard disk heads. Based on the graph in FIG. 5 in Non-Patent Document 2, the CPP-GMR element having an MR ratio of 77% and an RA of 33.4 $m\Omega \cdot \mu m^2$ described in Non-Patent Document 1 can be used in a hard disk having a critical current density Jc of 5.0 to $10 \times 10^7$ $A/cm^2$ but cannot be used in a hard disk having a critical current density Jc of lower than 5.0 to $10 \times 10^7$ $A/cm^2$. That is, in order for the CPP-GMR element to be used in a hard disk having a critical current density Jc of lower than 5.0 to $10 \times 10^7$ $A/cm^2$, it is necessary to further improve the MR ratio of the CPP-GMR element or increase the RA. However, generally, a CPP-GMR element has a problem in that the MR ratio tends to decrease as the RA increases.

In addition, not only a hard disk but also a magnetoresistive memory (MRAM) and the like are required to have a high MR ratio even if the RA is large.

The disclosure has been proposed in view of such circumstances in the related art, and an object of the disclosure is to provide a magnetoresistance effect element that can further increase an MR ratio (Magnetoresistance ratio) and an RA (Resistance Area product), and a Heusler alloy that can be beneficially used for an element or device using magnetism such as a magnetoresistance effect element.

The inventors have found that, when a Heusler alloy represented by a general formula of $Co_2Fe_\alpha X_\beta$ (in the formula, X represents one or more elements selected from the group consisting of Mn, Cr, Si, Al, Ga and Ge, and α and β represent numbers that satisfy 2.3≤α+β, α<β, and 0.5<α<1.9) is used as a material of a ferromagnetic layer, it is possible to further increase the MR ratio and RA of a magnetoresistance effect element. Therefore, the disclosure provides the following aspects in order to address the above problems.

[1] A magnetoresistance effect element according to a first aspect includes a first ferromagnetic layer, a second ferromagnetic layer, and a non-magnetic layer positioned between the first ferromagnetic layer and the second ferromagnetic layer, wherein at least one of the first ferromagnetic layer and the second ferromagnetic layer contains a Heusler alloy represented by the following General Formula (1):

$$Co_2Fe_\alpha X_\beta \quad (1)$$

(in Formula (1), X represents one or more elements selected from the group consisting of Mn, Cr, Si, Al, Ga and Ge, and α and β represent numbers that satisfy 2.3≤α+β, α<β, and 0.5<α<1.9).

[2] In the magnetoresistance effect element according to the aspect [1], the Heusler alloy may be an alloy represented by the following General Formula (2):

$$Co_2Fe_\alpha Ga_\gamma Y_{\beta-\gamma} \quad (2)$$

(in Formula (2), Y represents one or more elements selected from the group consisting of Mn, Cr, Si, Al and Ge, and α, β and γ represent numbers that satisfy 2.3≤α+β, α<β, and 0.5<α<1.9, 0.1≤γ).

[3] In the magnetoresistance effect element according to the above aspect, in General Formula (2), β and γ may represent numbers that satisfy 2×γ<β.

[4] In the magnetoresistance effect element according to the aspect [1], the Heusler alloy may be an alloy represented by the following General Formula (3):

$$Co_2Fe_\alpha Ge_6 Z_{\beta-\delta} \quad (3)$$

(in Formula (3), Z represents one or more elements selected from the group consisting of Mn, Cr, Si, Al and Ga, and α, β and δ represent numbers that satisfy 2.3≤α+β, α<β, and 0.5<α<1.9, 0.1≤δ).

[5] In the magnetoresistance effect element according to the above aspect, in General Formula (3), β and δ may represent numbers that satisfy 2×δ>β.

[6] In the magnetoresistance effect element according to the aspect [1], the Heusler alloy may be an alloy represented by the following General Formula (4):

$$Co_2Fe_\alpha Ga_\gamma Ge_\delta \quad (4)$$

(in Formula (4), α, γ and δ represent numbers that satisfy $2.3 \leq \alpha+\gamma+\delta$, $\alpha<\gamma+\delta$, and $0.5<\alpha<1.9$, $0.1 \leq \gamma$, $0.1 \leq \delta$).

[7] In the magnetoresistance effect element according to the above aspect, in General Formula (4), γ and δ may represent numbers that satisfy γ<δ.

[8] In the magnetoresistance effect element according to the above aspect, in General Formula (4), α, γ and δ may represent numbers that satisfy $2.3 \leq \alpha+\gamma+6<2.66$.

[9] In the magnetoresistance effect element according to the above aspect, in General Formula (4), α, γ and δ may represent numbers that satisfy $2.45<\alpha+\gamma+\delta<2.66$.

[10] In the magnetoresistance effect element according to the above aspect, in General Formula (4), δ may represent a number that satisfies $0.63 \leq \delta \leq 1.26$.

[11] In the magnetoresistance effect element according to the above aspect, in General Formula (4), δ may represent a number that satisfies $0.84 \leq \delta \leq 1.26$.

[12] In the magnetoresistance effect element according to the aspect [1], the Heusler alloy may be an alloy represented by the following General Formula (5):

$$Co_2Fe_\alpha Ga_\gamma Ge_\delta Mn_\epsilon \quad (5)$$

(in Formula (5), α, γ, δ and ε represent numbers that satisfy $2.3 \leq \alpha+\gamma+\delta+\epsilon$, $\alpha<\gamma+\delta+F$, and $0.5<\alpha<1.9$, $0.1 \leq \gamma$, $0.1 \leq \delta$, $0.1 \leq \epsilon$).

[13] In the magnetoresistance effect element according to the above aspect, in General Formula (5), δ and ε may represent numbers that satisfy δ<ε.

[14] In the magnetoresistance effect element according to the above aspect, in General Formula (5), F may represent a number that satisfies $0.38<\epsilon<0.76$.

[15] In the magnetoresistance effect element according to the above aspect, the non-magnetic layer may contain Ag.

[16] In the magnetoresistance effect element according to the above aspect, a NiAl layer containing a NiAl alloy may be provided between the first ferromagnetic layer and the non-magnetic layer and between the second ferromagnetic layer and the non-magnetic layer.

[17] In the magnetoresistance effect element according to the above aspect, the thickness t of the NiAl layer may satisfy $0<t\leq0.63$ nm.

[18] In the magnetoresistance effect element according to the above aspect, the NiAl alloy may contain a larger amount of Ni than of Al.

[19] In the magnetoresistance effect element according to the above aspect, the NiAl alloy may contain a larger amount of Al than of Ni.

[20] In the magnetoresistance effect element according to the above aspect, at least one of the first ferromagnetic layer and the second ferromagnetic layer may be a laminate including two or more ferromagnetic layers, and the ferromagnetic layer in contact with the non-magnetic layer among the two or more ferromagnetic layers may have a higher Fe concentration than the ferromagnetic layer on the side opposite to the non-magnetic layer.

[21] In the magnetoresistance effect element according to the above aspect, at least one of the first ferromagnetic layer and the second ferromagnetic layer may be a laminate including two or more ferromagnetic layers, the two or more ferromagnetic layers each may contain Ge, and the ferromagnetic layer in contact with the non-magnetic layer among the two or more ferromagnetic layers may have a lower Ge concentration than the ferromagnetic layer on the side opposite to the non-magnetic layer.

[22] In the magnetoresistance effect element according to the above aspect, at least one of the first ferromagnetic layer and the second ferromagnetic layer may be a laminate including two or more ferromagnetic layers, the two or more ferromagnetic layers each may contain Ga, and the ferromagnetic layer in contact with the non-magnetic layer among the two or more ferromagnetic layers may have a higher Ga concentration than the ferromagnetic layer on the side opposite to the non-magnetic layer.

[23] In the magnetoresistance effect element according to the above aspect, at least one of the first ferromagnetic layer and the second ferromagnetic layer may be a laminate including two or more ferromagnetic layers, and the ferromagnetic layer in contact with the non-magnetic layer among the two or more ferromagnetic layers may have a higher regularity than the ferromagnetic layer on the side opposite to the non-magnetic layer.

[24] In the magnetoresistance effect element according to the above aspect, on at least one of the first ferromagnetic layer and the second ferromagnetic layer, a layer containing Ni may be provided on the side opposite to the non-magnetic layer.

[25] A Heusler alloy according to a second aspect may be represented by the following General Formula (1):

$$Co_2Fe_\alpha X_\beta \quad (1)$$

(in Formula (1), X represents one or more elements selected from the group consisting of Mn, Cr, Si, Al, Ga and Ge, and α and β represent numbers that satisfy $2.3 \leq \alpha+\beta$, $\alpha<\beta$, and $0.5<\alpha<1.9$).

According to the disclosure, it is possible to provide a magnetoresistance effect element that can further increase an MR ratio (Magnetoresistance ratio) and an RA (Resistance Area product), and a Heusler alloy that can be beneficially used for an element or device using magnetism such as a magnetoresistance effect element.

BRIEF DESCRIPTION OF THE DRAWINGS

FIG. 2(a) to 2(c) show an example of a crystal structure of a full Heusler alloy, and FIG. 2(d) to 2(f) show an example of a crystal structure of a half Heusler alloy.

DETAILED DESCRIPTION OF THE INVENTION

Figure 1:
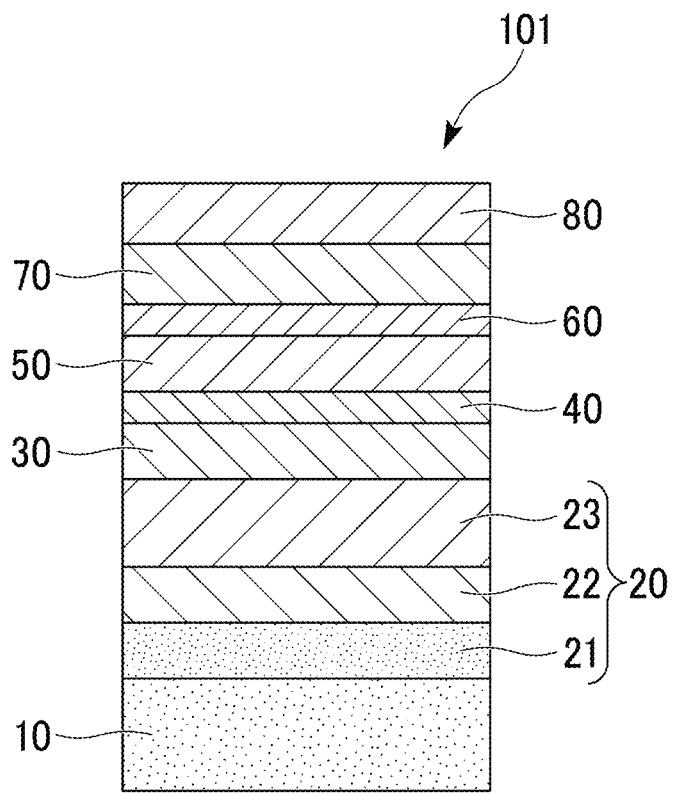
FIG. 1 is a cross-sectional view of a magnetoresistance effect element according to a first embodiment.

The disclosure will be appropriately described below in detail with reference to the drawings. In the drawings used in the following description, in order to facilitate understanding features of the disclosure, feature parts are enlarged for convenience of illustration in some cases, and size ratios and the like between components may be different from those of actual components. Materials, sizes, and the like exemplified in the following description are examples not limiting the disclosure, and they can be appropriately changed and implemented within a range not changing the scope and spirit of the invention.

First Embodiment

FIG. 1 is a cross-sectional view of a magnetoresistance effect element according to a first embodiment of the disclosure. FIG. 1 is a cross-sectional view of a magnetoresistance effect element 101 cut in a lamination direction of respective layers of the magnetoresistance effect element 101. The magnetoresistance effect element 101 is a laminate in which an underlayer 20, a first ferromagnetic layer 30, a first NiAl layer 40, a non-magnetic layer 50, a second NiAl layer 60, a second ferromagnetic layer 70, and a cap layer 80 are laminated in this order on a substrate 10. The non-magnetic layer 50 is positioned between the first ferromagnetic layer 30 and the second ferromagnetic layer 70. The first NiAl layer 40 is positioned between the first ferromagnetic layer 30 and the non-magnetic layer 50, and the second NiAl layer 60 is positioned between the non-magnetic layer 50 and the second ferromagnetic layer 70.

(Substrate)

The substrate 10 is a part serving as a base of the magnetoresistance effect element 101. A material having excellent flatness is preferably used for the substrate 10. The substrate 10 includes, for example, a metal oxide single crystal, a silicon single crystal, a silicon single crystal with a thermal oxide film, a sapphire single crystal, a ceramic, quartz, and glass. The material contained in the substrate 10 is not particularly limited as long as it has appropriate mechanical strength and is suitable for a heat treatment and microfabrication process. Examples of metal oxide single crystals include a MgO single crystal. For example, an epitaxial growth film can be easily formed on a substrate containing a MgO single crystal using a sputtering method. A magnetoresistance effect element using this epitaxial growth film exhibits high magnetic resistance characteristics. The type of the substrate 10 differs depending on a desired product. When the product is an MRAM, the substrate 10 is, for example, a Si substrate having a circuit structure. When the product is a magnetic head, the substrate 10 is, for example, an AlTiC substrate that is easy to process.

(Underlayer)

The underlayer 20 is positioned between the substrate 10 and the first ferromagnetic layer 30. The underlayer 20 is a 3-layer structure laminate in which a first underlayer 21, a second underlayer 22, and a third underlayer 23 are laminated in this order on the substrate 10.

The first underlayer 21 functions as a buffer layer that reduces a difference between a lattice constant of the substrate 10 and a lattice constant of the second underlayer 22. The material of the first underlayer 21 may be either a conductive material or an insulating material. The material of the first underlayer 21 differs depending on the material of the substrate 10 and the material of the second underlayer 22, but is, for example, a compound having a (001)-oriented NaCl structure. The compound having a NaCl structure is, for example, a nitride containing at least one element selected from the group consisting of Ti, Zr, Nb, V, Hf, Ta, Mo, W, B, Al, and Ce or an oxide containing at least one element selected from the group consisting of Mg, Al, and Ce.

In addition, regarding the material of the first underlayer 21, for example, a (002)-oriented perovskite conductive oxide represented by a composition formula of $ABO_3$ can be used. The perovskite conductive oxide is, for example, an oxide that contains at least one element selected from the group consisting of Sr, Ce, Dy, La, K, Ca, Na, Pb, and Ba at a site A and at least one element selected from the group consisting of Ti, V, Cr, Mn, Fe, Co, Ni, Ga, Nb, Mo, Ru, Ir, Ta, Ce, and Pb at a site B.

The second underlayer 22 functions as a seed layer that improves the crystallinity of an upper layer laminated on the second underlayer 22. The second underlayer 22 contains, for example, at least one type of MgO, TiN and NiTa alloys. In addition, for example, an alloy containing Co and Fe can be used. An alloy containing Co and Fe is, for example, Co—Fe, Co—Fe—B.

The third underlayer 23 functions as a buffer layer that reduces a difference between the lattice constant of the second underlayer 22 and the lattice constant of the first ferromagnetic layer 30. The third underlayer 23 may be a layer containing a metal element, for example, at least one metal element of Ag, Au, Cu, Cr, V, Al, W, and Pt so that it can be used as an electrode for allowing a detection current to flow. In addition, it may be a layer containing any of a metal having a function of generating a spin current due to a spin Hall effect when a current flows, an alloy, an intermetallic compound, a metal boride, a metal carbide, a metal silicide, and a metal phosphide. In addition, for example, it may be a layer having a (001)-oriented tetragonal structure or cubic structure and containing at least one element selected from the group consisting of Al, Cr, Fe, Co, Rh, Pd, Ag, Ir, Pt, Au, Mo, W, and Pt. The third underlayer 23 may be a laminate made of a material containing an alloy of these metal elements or two or more types of these metal elements. Examples of alloys of these metal elements include a cubic AgZn alloy, an AgMg alloy, a CoAl alloy, an FeAl alloy and a NiAl alloy.

Here, the underlayer 20 is used to improve the crystallinity of the upper layer formed on the underlayer 20 because it functions as a buffer layer that reduces a difference in lattice constant between the substrate 10 and the first ferromagnetic layer 30. As necessary, any of the first underlayer 21, the second underlayer 22, and the third underlayer 23 can be omitted. In addition, as necessary, any of the first underlayer 21, the second underlayer 22, and the third underlayer 23 can be formed of the same materials. In addition, as necessary, a plurality of respective underlayers can be laminated by increasing the number thereof.

(First Ferromagnetic Layer and Second Ferromagnetic Layer)

The first ferromagnetic layer 30 and the second ferromagnetic layer 70 are magnetic components. The first ferromagnetic layer 30 and the second ferromagnetic layer 70 each have a magnetization. The magnetoresistance effect element 101 outputs a change in relative angle between the magnetization of the first ferromagnetic layer 30 and the magnetization of the second ferromagnetic layer 70 as a change in resistance value.

For example, the magnetization of the second ferromagnetic layer 70 changes more easily than the magnetization of the first ferromagnetic layer 30. When a predetermined external force is applied, the magnetization direction of the first ferromagnetic layer 30 does not change (is fixed), and the magnetization direction of the second ferromagnetic layer 70 changes. When the magnetization direction of the second ferromagnetic layer 70 changes with respect to the magnetization direction of the first ferromagnetic layer 30, the resistance value of the magnetoresistance effect element 101 changes. In this case, the first ferromagnetic layer 30 may be called a magnetization fixed layer, and the second ferromagnetic layer 70 may be called a magnetization free layer. Hereinafter, a case in which the first ferromagnetic layer 30 is a magnetization fixed layer and the second ferromagnetic layer 70 is a magnetization free layer will be exemplified, but this relationship may be reversed.

A difference in ease of change between the magnetization of the first ferromagnetic layer 30 and the magnetization of the second ferromagnetic layer 70 when a predetermined external force is applied is caused by a difference in coercive force between the first ferromagnetic layer 30 and the second ferromagnetic layer 70. For example, when the thickness of the second ferromagnetic layer 70 is thinner than the thickness of the first ferromagnetic layer 30, a coercive force of the second ferromagnetic layer 70 is smaller than a coercive force of the first ferromagnetic layer 30. In addition, for example, an antiferromagnetic layer is provided on the surface of the first ferromagnetic layer 30 opposite to the non-magnetic layer 50 with a spacer layer therebetween. The first ferromagnetic layer 30, the spacer layer, and the antiferromagnetic layer form a synthetic antiferromagnetic structure (SAF structure). The synthetic antiferromagnetic structure includes two magnetic layers with a spacer layer therebetween. When the first ferromagnetic layer 30 and the antiferromagnetic layer are antiferromagnetically coupled, a coercive force of the first ferromagnetic layer 30 becomes larger than when there is no antiferromagnetic layer. The antiferromagnetic layer is formed of, for example, IrMn or PtMn. For example, the spacer layer contains at least one selected from the group consisting of Ru, Ir, and Rh. In a method of generating a coercive force difference according to the thickness, an additional layer such as an antiferromagnetic layer that may cause parasitic resistance is not necessary. On the other hand, in a method of generating a coercive force difference according to the SAF structure, it is possible to improve the orientation of the magnetization of the first ferromagnetic layer 30.

The first ferromagnetic layer 30 and the second ferromagnetic layer 70 each include a Heusler alloy represented by the following General Formula (1). Each of the first ferromagnetic layer 30 and the second ferromagnetic layer 70 is preferably made of a Heusler alloy represented by the following General Formula (1). However, the first ferromagnetic layer 30 and the second ferromagnetic layer 70 may contain inevitable impurities. The inevitable impurities are impurities that are inevitably mixed into production materials or mixed in a production process. The inevitable impurities include elements that constitute layers other than the first ferromagnetic layer 30 and the second ferromagnetic layer 70.

$$Co_2Fe_\alpha X_\beta \quad (1)$$

(in Formula (1), X represents one or more elements selected from the group consisting of Mn, Cr, Si, Al, Ga and Ge, and α and β represent numbers that satisfy $2.3 \leq \alpha+\beta$, $\alpha<\beta$, and $0.5<\alpha<1.9$).

The Heusler alloy is a half metal in which electrons carrying a current that flows through an alloy have only upward or downward spins, and ideally have a spin polarizability of 100%. The Heusler alloy generally has a composition of $Co_2Fe_\alpha X_\beta$ ($\alpha=\beta=1$) and has a lattice structure called an L21 structure. On the other hand, in the Heusler alloy of General Formula (1), α and β are set to $2.3 \leq \alpha+\beta$, which deviate from a stoichiometric composition. It is thought that, when a Heusler alloy which deviates from a stoichiometric composition is used as the material of the first ferromagnetic layer 30 and the second ferromagnetic layer 70, the magnetoresistance effect element 101 having a large MR ratio and RA can be obtained. However, when the composition of the Heusler alloy excessively deviates from the stoichiometric composition, there is a risk of defects occurring in the L21 structure and the effect of increasing the MR ratio and RA of the magnetoresistance effect element 101 being weakened. Therefore, α+β preferably satisfies $2.3 \leq \alpha+\beta<2.66$, and particularly preferably satisfies $2.45<\alpha+\beta<2.66$. Here, α is the number of Fe atoms when the number of Co atoms is 2, and β is the number of atoms of a component X when the number of Co atoms is 2.

In addition, in the Heusler alloy of General Formula (1), α and β satisfy $\alpha<\beta$. Accordingly, antisites in which Fe atoms are substituted into Co atom sites are inhibited. Thereby, the variation in the Fermi level due to antisites in which Fe atoms are substituted into Co atom sites is minimized, and characteristics of the Heusler alloy as a half metal can be stably exhibited. Therefore, the MR ratio of the magnetoresistance effect element 101 is improved. However, when β is too large, that is, when the amount of the component X is much larger than that of Fe, there is a risk of defects occurring in the L21 structure and the effect of improving the MR ratio of the magnetoresistance effect element 101 being weakened. α and β preferably satisfy $\alpha<\beta<2\times\alpha$ and particularly preferably satisfy $\alpha<\beta<1.5\times\alpha$.

In addition, in the Heusler alloy of General Formula (1), α satisfies $0.5<\alpha<1.9$. Accordingly, it is possible to secure high spin polarizability of the Heusler alloy. Accordingly, the MR ratio of the magnetoresistance effect element 101 becomes larger. In order to inhibit antisites in which Fe atoms are substituted into Co atom sites while maintaining the effect of improving the MR ratio of the magnetoresistance effect element 101, α preferably satisfies $0.8<\alpha<1.33$ and particularly preferably satisfies $0.9<\alpha<1.2$.

The component X is one or more elements selected from the group consisting of Mn, Cr, Si, Al, Ga and Ge. Among these elements, Mn, Ga and Ge are preferable.

The Heusler alloy of General Formula (1) is preferably, for example, an alloy represented by the following General Formula (2).

$$Co_2Fe_\alpha Ga_\gamma Y_{\beta-\gamma} \qquad (2)$$

(in Formula (2), Y represents one or more elements selected from the group consisting of Mn, Cr, Si, Al and Ge, and $\alpha$, $\beta$ and $\gamma$ represent numbers that satisfy $2.3 \le \alpha+\beta$, $\alpha<\beta$, and $0.5<\alpha<1.9$, $0.1 \le \gamma$).

Since the Heusler alloy of General Formula (2) includes 0.1 or more Ga atoms when the number of Co atoms is 2, it can be regularized at a low temperature. Therefore, in the magnetoresistance effect element 101 using the Heusler alloy of General Formula (2), atomic interdiffusion is reduced in all elements, and the MR ratio is improved.

In the Heusler alloy of General Formula (2), preferably, $\beta$ and $\gamma$ represent numbers that satisfy $2\times\gamma<\beta$, that is, the number of Ga atoms is smaller than the number of atoms of a component Y. Accordingly, it is possible to prevent Ga from diffusing into other layers due to an excessively large number of Ga atoms.

In addition, the Heusler alloy of General Formula (1) is preferably, for example, an alloy represented by the following General Formula (3).

$$Co_2Fe_\alpha Ge_\delta Z_{\beta-\delta} \qquad (3)$$

(in Formula (3), Z represents one or more elements selected from the group consisting of Mn, Cr, Si, Al and Ga, and $\alpha$, $\beta$ and $\delta$ represent numbers that satisfy $2.3 \le \alpha+\beta$, $\alpha<\beta$, and $0.5<\alpha<1.9$, $0.1 \le \delta$).

The Heusler alloy of General Formula (3) includes 0.1 or more Ge atoms when the number of Co atoms is 2. Ge is a semiconductor element and has a function of increasing the resistivity of the Heusler alloy. Therefore, the magnetoresistance effect element 101 using the Heusler alloy of General Formula (3) has a larger RA.

In the Heusler alloy of General Formula (3), preferably, $\beta$ and $\delta$ represent numbers that satisfy $2\times\delta>\beta$, that is, the number of Ge atoms is larger than the number of atoms of a component Z. Accordingly, the effect of Ge atoms can be obtained more reliably. However, when the Ge content is too large, since the resistivity of the Heusler alloy is too large, there is a risk of Ge becoming a parasitic resistance component of the magnetoresistance effect element 101 and the magnetoresistance effect being weakened. Therefore, $\delta$ more preferably satisfies $0.63<\delta<1.26$ and particularly preferably satisfies $0.84<\delta<1.26$.

In addition, the Heusler alloy of General Formula (1) is preferably, for example, an alloy represented by the following General Formula (4).

$$Co_2Fe_\alpha Ga_\gamma Ge_\delta \qquad (4)$$

(in Formula (4), $\alpha$, $\gamma$ and $\delta$ represent numbers that satisfy $2.3 \le \alpha+\gamma+\delta$, $\alpha<\gamma+\delta$, and $0.5<\alpha<1.9$, $0.1\le\gamma$, $0.1\le\delta$).

The Heusler alloy of General Formula (4) is an alloy containing Ga and Ge as the component X in the Heusler alloy of General Formula (1). Therefore, $\gamma+\delta$ in General Formula (4) corresponds to $\beta$ in General Formula (1). The Heusler alloy of General Formula (4) has improved characteristics as a half metal due to a synergistic effect of Ga and Ge, and an improved spin polarizability. Therefore, the magnetoresistance effect element 101 using the Heusler alloy of General Formula (4) has a larger MR ratio and RA due to the synergistic effect of Ga and Ge.

In General Formula (4), preferably, $\gamma$ and $\delta$ represent numbers that satisfy $\gamma<\delta$, that is, the number of Ge atoms is larger than the number of Ga atoms. In addition, $\delta$ more preferably satisfies $0.63<\delta<1.26$ and particularly preferably satisfies $0.84<\delta<1.26$. When $\gamma$ and $\delta$ satisfy this relationship, the effects of Ga and Ge are strongly exhibited and the MR ratio and RA of the magnetoresistance effect element 101 become larger.

In addition, in General Formula (4), $\alpha$, $\gamma$ and $\delta$ preferably satisfy $2.3\le\alpha+\gamma+\delta<2.66$ and particularly preferably satisfy $2.45<\alpha+\gamma+\delta<2.66$. When $\alpha$, $\gamma$ and $\delta$ satisfy this relationship, the MR ratio and RA of the magnetoresistance effect element 101 become larger.

In addition, the Heusler alloy of General Formula (1) is preferably, for example, an alloy represented by the following General Formula (5)

$$Co_2Fe_\alpha Ga_\gamma Ge_\delta Mn_\varepsilon \qquad (5)$$

(in Formula (5), $\alpha$, $\gamma$, $\delta$ and $\varepsilon$ represent numbers that satisfy $2.3\le\alpha+\gamma+\delta+\varepsilon$, $\alpha<\gamma+\delta+\varepsilon$, and $0.5<\alpha<1.9$, $0.1\le\gamma$, $0.1\le\delta$, $0.1\le\varepsilon$).

The Heusler alloy of General Formula (5) is an alloy containing Ga, Ge, and Mn as the component X in the Heusler alloy of General Formula (1). Therefore, $\gamma+\delta+\varepsilon$ in General Formula (5) corresponds to $\beta$ in General Formula (1).

Mn has an effect of increasing the MR ratio and RA of the magnetoresistance effect element 101 when it coexists with Ga and Ge. In addition, in this case antisites in which Mn atoms are substituted into Co atom sites do not inhibit half metal characteristics. In General Formula (5), preferably, $\delta$ and $\varepsilon$ represent numbers that satisfy $\delta<\varepsilon$, that is, the number of Mn atoms is larger than the number of Ge atoms. In addition, preferably, $\gamma$ and $\delta$ represent numbers that satisfy $\delta<\gamma$, that is, the number of Ga atoms is larger than the number of Ge atoms. Specifically, preferably, $\gamma$ satisfies $0.4<\gamma<0.6$, $\delta$ satisfies $0.2<\delta<0.4$, and $\varepsilon$ satisfies $0.38<\varepsilon<0.76$. When $\gamma$, $\delta$ and $\varepsilon$ satisfy this relationship, the effects of Ga, Ge, and Mn are strongly exhibited, and the MR ratio and RA of the magnetoresistance effect element 101 become larger.

In addition, in General Formula (5), $\alpha$, $\gamma$, $\delta$ and $\varepsilon$ preferably satisfy $2.3\le\alpha+\gamma+\delta+\varepsilon<2.66$ and particularly preferably satisfy $2.45<\alpha+\gamma+\delta+\varepsilon<2.66$. When $\alpha$, $\gamma$, $\delta$ and $\varepsilon$ satisfy this relationship, the MR ratio and RA of the magnetoresistance effect element 101 become larger.

Each of the first ferromagnetic layer 30 and the second ferromagnetic layer 70 may be a single layer or may be a laminate including two or more layers. When the first ferromagnetic layer 30 and the second ferromagnetic layer 70 are a laminate, respective ferromagnetic layers may have different compositions and regularities. When the first ferromagnetic layer 30 and/or the second ferromagnetic layer 70 are a laminate, a ferromagnetic layer in contact with the non-magnetic layer 50 among two or more ferromagnetic layers preferably has an Fe concentration that is equal to or higher than that of the ferromagnetic layer opposite to the non-magnetic layer 50. However, the Fe concentration of the ferromagnetic layer in contact with the non-magnetic layer 50 is preferably 3 times or less the Fe concentration of the ferromagnetic layer opposite to the non-magnetic layer 50. In addition, when two or more ferromagnetic layers each contains Ge, the ferromagnetic layer in contact with the non-magnetic layer 50 among the two or more ferromagnetic layers preferably has a Ge concentration that is equal to or smaller than that of the ferromagnetic layer opposite to the non-magnetic layer 50. However, the Ge concentration of the ferromagnetic layer in contact with the non-magnetic layer 50 is preferably ⅓ or more of the Ge concentration of the ferromagnetic layer opposite to the non-magnetic layer 50. In addition, when two or more ferromagnetic layers each contains Ga, the ferromagnetic layer in contact with the non-magnetic layer 50 among the two or more ferromagnetic layers preferably has a Ga concentration that is equal to or larger than that of the ferromagnetic layer opposite to the non-magnetic layer 50. However, the Ga concentration of the ferromagnetic layer in contact with the non-magnetic layer 50 is preferably 3 times or less the Ga concentration of the ferromagnetic layer opposite to the non-magnetic layer 50. In addition, the ferromagnetic layer in contact with the non-magnetic layer 50 among the two or more ferromagnetic layers preferably has a higher regularity than the ferromagnetic layer opposite to the non-magnetic layer 50.

When the first ferromagnetic layer 30 and/or the second ferromagnetic layer 70 are a single layer, the surface in contact with the non-magnetic layer 50 preferably has an Fe concentration that is equal to or higher than that of the surface on the side opposite to the non-magnetic layer 50. However, the Fe concentration of the layer in contact with the non-magnetic layer 50 is preferably 3 times or less the Fe concentration of the surface on the side opposite to the non-magnetic layer 50. In addition, when the first ferromagnetic layer 30 and/or the second ferromagnetic layer 70 contain Ge, the surface in contact with the non-magnetic layer 50 preferably has a Ge concentration that is equal to or smaller than that of the surface on the side opposite to the non-magnetic layer 50. However, the Ge concentration of the surface in contact with the non-magnetic layer 50 is preferably 1/3 or more of the Ge concentration of the surface on the side opposite to the non-magnetic layer 50. In addition, when the first ferromagnetic layer 30 and/or the second ferromagnetic layer 70 contain Ga, the surface in contact with the non-magnetic layer 50 preferably has a Ga concentration that is equal to or larger than that of the surface on the side opposite to the non-magnetic layer 50. However, the Ga concentration of the surface in contact with the non-magnetic layer 50 is preferably 3 times or less the Ga concentration of the surface on the side opposite to the non-magnetic layer 50. In addition, the surface in contact with the non-magnetic layer 50 of the first ferromagnetic layer 30 and the second ferromagnetic layer 70 preferably has a higher regularity than the surface on the side opposite to the non-magnetic layer 50.

Figure 2:
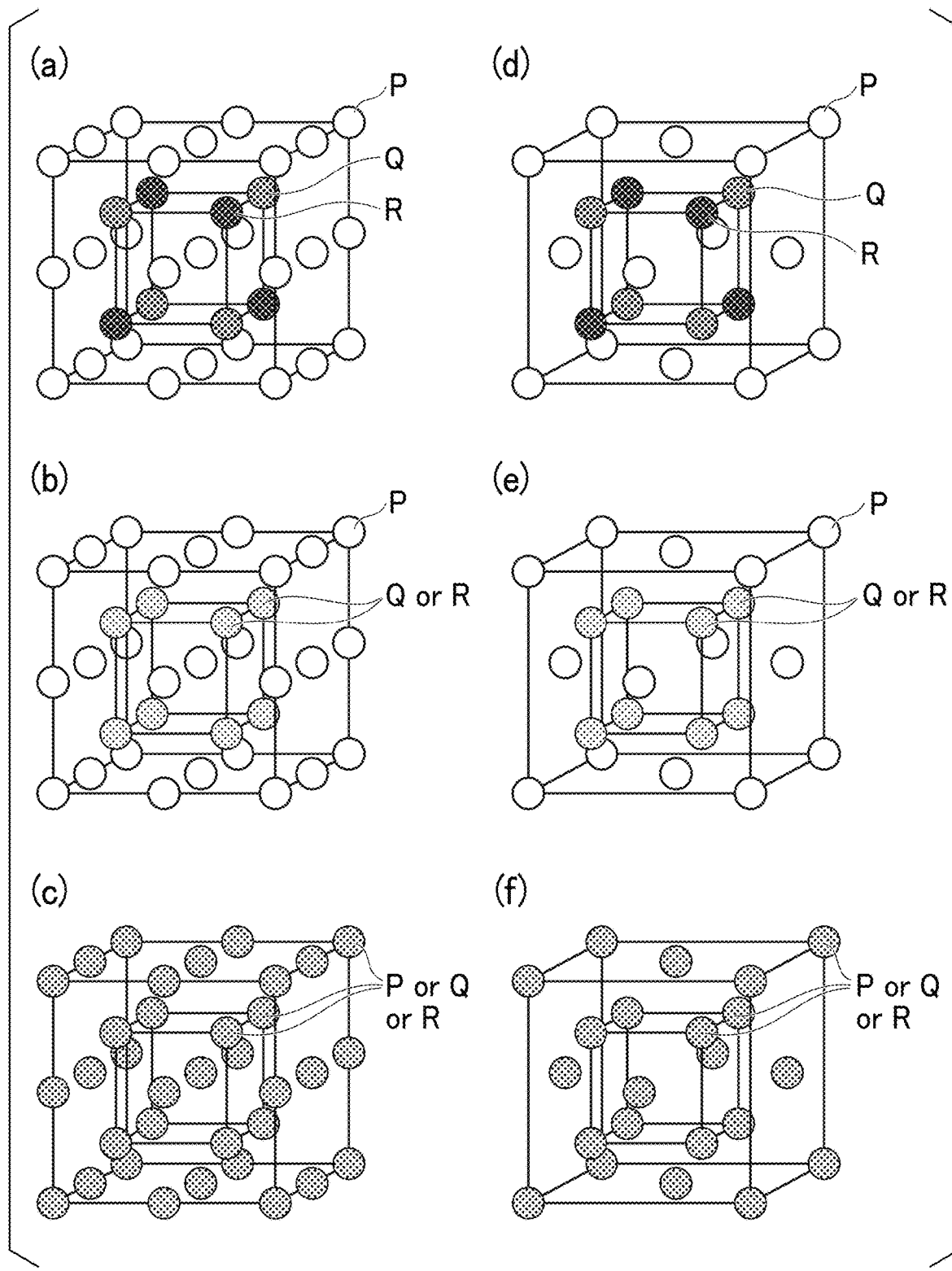
FIG. 2 shows schematic views of an example of a crystal structure of a Heusler alloy.

Here, the regularity of the ferromagnetic layer will be described. FIG. 2 shows schematic views of an example of a crystal structure of a Heusler alloy, FIG. 2(a) to 2(c) show an example of a crystal structure of a full Heusler alloy, and FIG. 2(d) to 2(f) show an example of a crystal structure of a half Heusler alloy.

The crystal structure shown in FIG. 2(a) is called an L21 structure. In the L21 structure, the elements that enter the P sites, the elements that enter the Q sites, and the elements that enter the R sites are fixed. The crystal structure shown in FIG. 2(b) is called a B2 structure derived from the L21 structure. In the B2 structure, the elements that enter the Q sites and the elements that enter the R sites are mixed, and the elements that enter the P sites are fixed. The crystal structure shown in FIG. 2(c) is called an A2 structure derived from the L21 structure. In the A2 structure, the elements that enter the P sites, the elements that enter the Q sites, and the elements that enter the R sites are mixed.

The crystal structure shown in FIG. 2(d) is called a $C1_b$ structure. In the $C1_b$ structure, the elements that enter the P sites, the elements that enter the Q sites, and the elements that enter the R sites are fixed. The crystal structure shown in FIG. 2(e) is called a B2 structure derived from the $C1_b$ structure. In the B2 structure, the elements that enter the Q sites and the elements that enter the R sites are mixed, and the elements that enter the P sites are fixed. The crystal structure shown in FIG. 2(f) is called an A2 structure derived from the $C1_b$ structure. In the A2 structure, the elements that enter the P sites, the elements that enter the Q sites, and the elements that enter the R sites are mixed.

Full Heusler alloys have decreasing regularity in the order of L21 structure>B2 structure>A2 structure, and half Heusler alloys have a decreasing regularity in the order of $C1_b$ structure>B2 structure>A2 structure. While these crystal structures have different regularities, they are all crystals.

When the first ferromagnetic layer 30 and/or the second ferromagnetic layer 70 are a single layer, the surface in contact with the non-magnetic layer 50 preferably has a higher Fe concentration than the surface on the side opposite to the non-magnetic layer 50. In addition, when the first ferromagnetic layer 30 and/or the second ferromagnetic layer 70 contain Ge, the surface in contact with the non-magnetic layer 50 preferably has a smaller Ge concentration than the surface on the side opposite to the non-magnetic layer 50 In addition, when the first ferromagnetic layer 30 and/or the second ferromagnetic layer 70 contain Ga, the surface in contact with the non-magnetic layer 50 preferably has a higher Ga concentration than the surface on the side opposite to the non-magnetic layer 50. In addition, the surface in contact with the non-magnetic layer 50 preferably has a higher regularity than the surface on the side opposite to the non-magnetic layer 50.

The Heusler alloy constituting the first ferromagnetic layer 30 and the second ferromagnetic layer 70 crystallizes. Whether the Heusler alloy has crystallized can be determined using a transmission electron microscope (TEM) image (for example, high-angle annular dark-field scanning transmission electron microscope image: HAADF-STEM image) or an electron beam diffraction image using a transmission electron beam. When the Heusler alloy has crystallized, a status in which atoms are regularly arranged can be confirmed, for example, in the HAADF-STEM image captured using the TEM. More specifically, in the Fourier transform image of the HAADF-STEM image, spots derived from the crystal structure of the Heusler alloy appear. In addition, when the Heusler alloy has crystallized, diffraction spots can be confirmed from at least one plane among the (001) plane, the (002) plane, the (110) plane, and the (111) plane in the electron beam diffraction image. When crystallization is confirmed by at least one of the methods, it can be said that at least a part of the Heusler alloy has crystallized.

In addition, the crystal structure of the Heusler alloy can be measured by X-ray diffraction (XRD), reflection high-energy electron diffraction (RHEED), or the like. For example, in the case of XRD, when the Heusler alloy has an L21 structure, (200) and (111) peaks are exhibited, and when the Heusler alloy has a B2 structure, the (200) peak is exhibited but the (111) peak is not exhibited. For example, in the case of RHEED, when the Heusler alloy has an L21 structure, the (200) streak and the (111) streak are exhibited, and when the Heusler alloy has a B2 structure, the (200) streak is exhibited but the (111) streak is not exhibited.

The composition analysis of respective layers constituting the magnetoresistance effect element can be performed using energy dispersive X-ray analysis (EDS). In addition, when EDS line analysis is performed, for example, the composition distribution of respective materials in the film thickness direction can be confirmed.

In addition, the composition of the Heusler alloy can be measured using an X-ray fluorescence method (XRF), inductively coupled plasma (ICP) atomic emission spectroscopy, secondary ion mass spectrometry (SIMS), auger electron spectroscopy (AES), or the like.

(First NiAl Layer and Second NiAl Layer)

The first NiAl layer 40 and the second NiAl layer 60 are layers containing a NiAl alloy. The first NiAl layer 40 functions as a buffer layer that reduces a lattice mismatch between the first ferromagnetic layer 30 and the non-magnetic layer 50, and the second NiAl layer 60 functions as a buffer layer that reduces a lattice mismatch between the non-magnetic layer 50 and the second ferromagnetic layer 70. According to the function of the first NiAl layer 40 and the second NiAl layer 60, the MR ratio of the magnetoresistance effect element 101 is further improved.

The thickness t of each of the first NiAl layer 40 and the second NiAl layer 60 preferably satisfies $0 < t \leq 0.63$ nm. When the thickness t is too thick, there is a risk of electrons moving from the first ferromagnetic layer 30 (the second ferromagnetic layer 70) to the second ferromagnetic layer 70 (the first ferromagnetic layer 30) being spin-scattered. When the thickness t is within this range, spin scattering in the electrons that move is minimized, a lattice mismatch between the first ferromagnetic layer 30 and the non-magnetic layer 50 is reduced, and a lattice mismatch between the non-magnetic layer 50 and the second ferromagnetic layer 70 is reduced. As a result, the magnetoresistance effect is particularly improved.

Each of the first NiAl layer 40 and the second NiAl layer 60 is preferably a layer made of a NiAl alloy. The first NiAl layer 40 and the second NiAl layer 60 may contain inevitable impurities. The inevitable impurities include elements that constitute layers other than the first NiAl layer 40 and the second NiAl layer 60. In addition, proportions of Ni and Al contained in the NiAl alloy may be the same as or different from each other. The proportions of Ni and Al are preferably in a range of 1:3 to 3:1 in terms of molar ratio. In addition, the first NiAl layer 40 and the second NiAl layer 60 may have different proportions of Ni and Al. For example, the first NiAl layer 40 may contain a larger amount of Al than of Ni, and the second NiAl layer 60 may contain a larger amount of Ni than of Al.

(Non-Magnetic Layer)

The non-magnetic layer 50 contains a non-magnetic metal. The non-magnetic layer 50 is preferably made of a non-magnetic metal. However, the non-magnetic layer may contain inevitable impurities. The inevitable impurities include elements that constitute layers other than the non-magnetic layer 50. Examples of materials of the non-magnetic layer 50 include Cu, Au, Ag, Al, and Cr. The non-magnetic layer 50 preferably contains one or more elements selected from the group consisting of Ag, Cu, Au, Ag, Al, and Cr as a main constituent element. The main constituent element means that a proportion of Cu, Au, Ag, Al, or Cr in the composition formula is 50% or more. The non-magnetic layer 50 preferably contains Ag, and preferably contains Ag as a main constituent element. Since Ag has a long spin diffusion length, the magnetoresistance effect element 101 using Ag has a larger MR ratio.

For example, the non-magnetic layer 50 has a thickness in a range of 1 nm or more and 10 nm or less. The non-magnetic layer 50 inhibits magnetic coupling between the first ferromagnetic layer 30 and the second ferromagnetic layer 70.

(Cap Layer)

The cap layer 80 is positioned on the side of the magnetoresistance effect element 101 opposite to the substrate 10. The cap layer 80 is provided to protect the second ferromagnetic layer 70. The cap layer 80 minimizes diffusion of atoms from the second ferromagnetic layer 70. In addition, the cap layer 80 contributes to crystal orientation of respective layers of the magnetoresistance effect element 101. When the cap layer 80 is provided, the magnetization of the first ferromagnetic layer 30 and the second ferromagnetic layer 70 can be stabilized and the MR ratio of the magnetoresistance effect element 101 can be improved.

The cap layer 80 preferably contains a material having high conductivity so that it can be used as an electrode for allowing a detection current to flow. For example, the cap layer 80 may contain one or more metal elements of Ru, Ag, Al, Cu, Au, Cr, Mo, Pt, W, Ta, Pd, and Ir, an alloy of these metal elements, or a laminate made of a material containing two or more types of these metal elements.

In the magnetoresistance effect element 101 of the present embodiment, on at least one of the first ferromagnetic layer 30 and the second ferromagnetic layer 70, a layer containing Ni may be provided on the side opposite to the non-magnetic layer 50. That is, an insertion layer containing Ni may be inserted between the first ferromagnetic layer 30 and the substrate 10 (the underlayer 20 when the underlayer 20 is provided) and/or between the second ferromagnetic layer 70 and the cap layer 80. The insertion layer (first insertion layer) between the first ferromagnetic layer 30 and the substrate 10 (or the underlayer 20) and the insertion layer (second insertion layer) between the second ferromagnetic layer 70 and the cap layer 80 are preferably made of Ni. However, the first insertion layer and the second insertion layer may contain inevitable impurities. The inevitable impurities include elements that constitute layers other than the first insertion layer and the second insertion layer.

Next, a method of producing the magnetoresistance effect element 101 according to the present embodiment will be described. For example, the magnetoresistance effect element 101 can be obtained by laminating the underlayer 20 (the first underlayer 21, the second underlayer 22, and the third underlayer 23), the first ferromagnetic layer 30, the first NiAl layer 40, the non-magnetic layer 50, the second NiAl layer 60, the second ferromagnetic layer 70, and the cap layer 80 in this order on the substrate 10. Regarding a method of forming each layer, for example, a sputtering method, a vapor deposition method, a laser ablation method, or a molecular beam epitaxy (MBE) method can be used. Regarding a method of forming a first insertion layer and a second insertion layer, for example, a sputtering method, a vapor deposition method, a laser ablation method or a molecular beam epitaxy (MBE) method can be used.

In addition, after the underlayer 20 is formed or after the second ferromagnetic layer 70 is laminated, the substrate 10 may be annealed. According to annealing, the crystallinity of respective layers is improved.

The ratio of Ni and Al in the first NiAl layer 40 and the second NiAl layer 60 can be adjusted by a co-sputtering method. For example, a NiAl layer containing a large amount of Ni can be formed by a co-sputtering method using a NiAl alloy target and a Ni target. Similarly, a NiAl layer containing a large amount of Al can be formed by a co-sputtering method using a NiAl alloy target and an Al target.

When the first ferromagnetic layer 30 and/or the second ferromagnetic layer 70 is a laminate, the composition of the ferromagnetic layer can be adjusted by a co-sputtering method. Two ferromagnetic layers having different iron concentrations can be obtained, for example, one layer is formed by a sputtering method using a CoFeGaGe alloy target and the other layer is formed by a co-sputtering method using a CoFeGaGe alloy target and an Fe target.

When the first ferromagnetic layer 30 and/or the second ferromagnetic layer 70 are a single layer, the composition of the ferromagnetic layer can be adjusted by a co-sputtering method using a CoFeGaGe alloy target and an Fe target. For example, regarding the ferromagnetic layer in which the iron concentration differs between the surface in contact with the non-magnetic layer 50 and the surface on the side opposite to the non-magnetic layer 50, the ferromagnetic layer having an iron concentration gradient in the first ferromagnetic layer 30 and/or the second ferromagnetic layer 70 can be obtained by setting a film-forming power of a CoFeGaGe alloy target to be constant and by performing deposition while continuously changing a film-forming power of the Fe target.

When the first ferromagnetic layer 30 and/or the second ferromagnetic layer 70 are a laminate, the regularity of the ferromagnetic layer can be adjusted by a heat treatment for film formation. When the ferromagnetic layer after film formation is heated at a relatively high temperature, a ferromagnetic layer having high regularity is obtained, and when the ferromagnetic layer after film formation is heated at a relatively low temperature, a ferromagnetic layer having a low regularity is obtained. Since the relationship between the regularity and the heat treatment temperature varies depending on the material and thickness of the ferromagnetic layer, the heat treatment temperature cannot be determined uniformly. However, in order to obtain a ferromagnetic layer having high regularity, the heat treatment temperature is preferably in a range of 400° C. or higher and 700° C. or lower.

The magnetoresistance effect element 101 according to the present embodiment can be used as, for example, a current-perpendicular-to-plane-giant magnetic resistance element (CPP-GMR element) that exhibits a magnetoresistance effect by causing a current to flow through the magnetoresistance effect element 101 in the direction perpendicular to the film surface.

In the magnetoresistance effect element 101 of the present embodiment configured as described above, since the first ferromagnetic layer 30 and the second ferromagnetic layer 70 are formed using a specific Heusler alloy represented by any one of the above General Formulae (1) to (5), high spin polarizability can be secured in the first ferromagnetic layer 30 and the second ferromagnetic layer 70, and a relatively high resistivity is obtained. Therefore, the MR ratio (Magnetoresistance ratio) and RA (Resistance Area product) of the magnetoresistance effect element 101 become larger. Therefore, when the magnetoresistance effect element 101 is used as the current-perpendicular-to-plane-giant magnetic resistance element (CPP-GMR element), it is possible to reduce a current density during operation.

In addition, in the magnetoresistance effect element 101 of the present embodiment, the following actions and effects can be obtained. Here, the following actions and effects can be obtained in the magnetoresistance effect element in which the material of the first ferromagnetic layer 30 and/or the second ferromagnetic layer 70 is a Heusler alloy having a stoichiometric composition.

In addition, when the first ferromagnetic layer 30 and/or the second ferromagnetic layer 70 are a laminate, the Fe concentration of the ferromagnetic layer in contact with the non-magnetic layer 50 among two or more ferromagnetic layers is set to be higher than that of the ferromagnetic layer on the side opposite to the non-magnetic layer 50, and thus the magnetization near the interface with the non-magnetic layer 50 is stable. As a result, the MR ratio of the magnetoresistance effect element 101 is improved. In particular, when the Fe concentration of the ferromagnetic layer in contact with the non-magnetic layer 50 within the first ferromagnetic layer 30 is set to be higher than that of the ferromagnetic layer on the side of the substrate 10, this effect can be more easily obtained.

In addition, if the first ferromagnetic layer 30 and/or the second ferromagnetic layer 70 are a laminate, when two or more ferromagnetic layers each contains Ge, the Ge concentration of the ferromagnetic layer in contact with the non-magnetic layer 50 among two or more ferromagnetic layers is set to be lower than that of the ferromagnetic layer on the side opposite to the non-magnetic layer 50, and thus the magnetization near the interface with the non-magnetic layer 50 is stable. As a result, the MR ratio of the magnetoresistance effect element 101 is improved. In particular, when the Ge concentration of the ferromagnetic layer in contact with the non-magnetic layer 50 within the first ferromagnetic layer 30 is set to be smaller than that of the ferromagnetic layer on the side of the substrate 10, this effect can be more easily obtained.

In addition, if the first ferromagnetic layer 30 and/or the second ferromagnetic layer 70 are a laminate, when two or more ferromagnetic layers each contains Ga, the Ga concentration of the ferromagnetic layer in contact with the non-magnetic layer 50 among two or more ferromagnetic layers is set to be higher than that of the ferromagnetic layer on the side opposite to the non-magnetic layer 50, and thus the interface resistance with the non-magnetic layer 50 can increase. As a result, the RA increases and the MR ratio of the magnetoresistance effect element 101 is improved. In particular, when the Ga concentration of the ferromagnetic layer in contact with the non-magnetic layer 50 of both the first ferromagnetic layer 30 and the second ferromagnetic layer 70 increases, this effect can be more easily obtained.

In addition, when the first ferromagnetic layer 30 and/or the second ferromagnetic layer 70 are a laminate, the regularity of the ferromagnetic layer in contact with the non-magnetic layer 50 among two or more ferromagnetic layers is set to be higher than that of the ferromagnetic layer on the side opposite to the non-magnetic layer 50, and thus the spin polarizability near the interface with the non-magnetic layer 50 can increase. As a result, the MR ratio of the magnetoresistance effect element 101 is improved. In particular, when the regularity of the ferromagnetic layer in contact with the non-magnetic layer 50 within the second ferromagnetic layer 70 is set to be higher than that of the ferromagnetic layer on the side of the cap layer 80, this effect can be more easily obtained.

In addition, when the first NiAl layer 40 or the second NiAl layer 60 contains a larger amount of Ni than that of Al, it is possible to increase the interface resistance with the non-magnetic layer 50. On the other hand, when the first NiAl layer 40 or the second NiAl layer 60 contains a larger amount of Al than that of Ni, it is possible to lower the resistivity of the first NiAl layer 40 or the second NiAl layer 60 and the parasitic resistance of the magnetoresistance effect element 101 having a GMR structure.

In addition, when one of the first NiAl layer 40 and the second NiAl layer 60 contains a larger amount of Ni than that of Al, and the other contains a larger amount of Al than that of Ni, it is possible to increase the interface resistance with the non-magnetic layer 50, lower the resistivity of the first NiAl layer 40 or the second NiAl layer 60, and more reliably lower the parasitic resistance of the magnetoresistance effect element 101 having a GMR structure. In particular, when the first NiAl layer 40 contains a larger amount of Al than that of Ni and the second NiAl layer 60 contains a larger amount of Ni than that of Al, this effect can be more easily obtained.

In addition, on at least one of the first ferromagnetic layer 30 and the second ferromagnetic layer 70, a layer (insertion layer) containing Ni is provided on the side opposite to the non-magnetic layer 50, and thus it is possible to reduce atomic interdiffusion between the underlayer 20 and the first ferromagnetic layer 30 or between the second ferromagnetic layer 70 and the cap layer 80.

Second Embodiment

Figure 3:
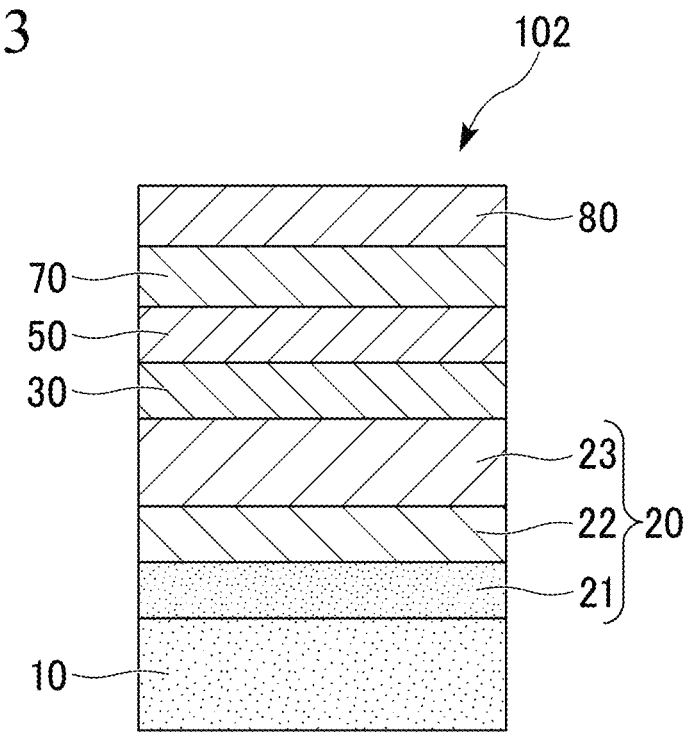
FIG. 3 is a cross-sectional view of a magnetoresistance effect element according to a second embodiment.

FIG. 3 is a cross-sectional view of a magnetoresistance effect element according to a second embodiment of the disclosure. A magnetoresistance effect element 102 is different from the magnetoresistance effect element 101 shown in FIG. 1 that it does not include the first NiAl layer 40 and the second NiAl layer 60. Therefore, in FIG. 3, components the same as those in FIG. 1 are denoted with the same reference numerals and descriptions thereof are omitted.

In the magnetoresistance effect element 102 of the present embodiment, since the first ferromagnetic layer 30 and the second ferromagnetic layer 70 are formed using a specific Heusler alloy, the same effects as those in the first embodiment can be obtained. In addition, the first ferromagnetic layer 30, the non-magnetic layer 50, and the second ferromagnetic layer 70 are in direct contact with each other without the first NiAl layer and the second NiAl layer. Accordingly, there are three layers that exhibit the magnetoresistance effect: the first ferromagnetic layer 30, the second ferromagnetic layer 70, and the non-magnetic layer 50, and it is possible to decrease the thickness of the magnetoresistance effect element. Accordingly, a thin magnetoresistance effect element having a thickness suitable for high recording density can be obtained. In addition, since a process of forming the first NiAl layer 40 and the second NiAl layer 60 is not necessary, the production process can be simplified.

Third Embodiment

Figure 4:
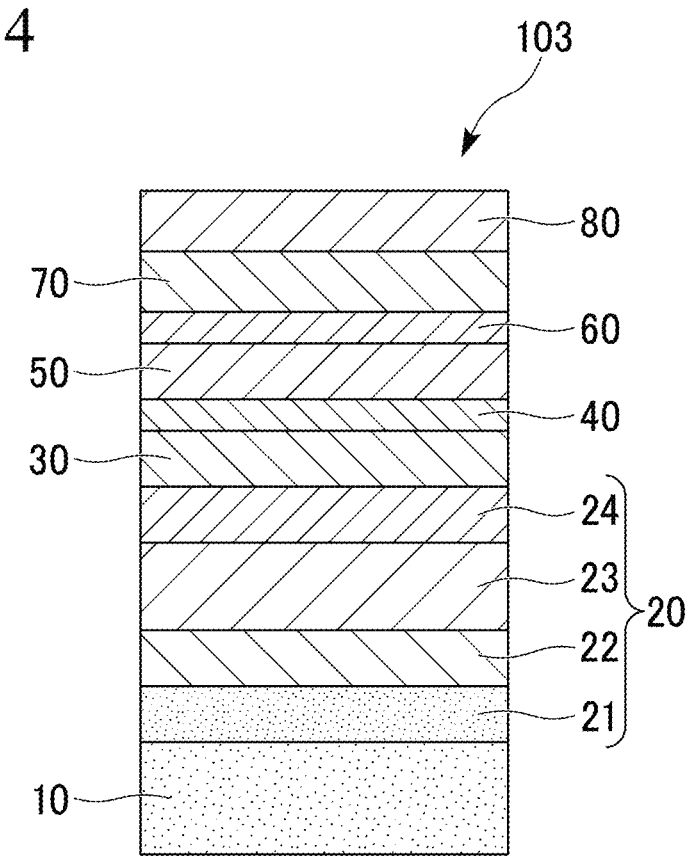
FIG. 4 is a cross-sectional view of a magnetoresistance effect element according to a third embodiment.

FIG. 4 is a cross-sectional view of a magnetoresistance effect element according to a third embodiment of the disclosure. A magnetoresistance effect element 103 is different from the magnetoresistance effect element 101 shown in FIG. 1 in that the underlayer 20 includes a fourth underlayer 24. Therefore, in FIG. 4, components the same as those in FIG. 1 are denoted with the same reference numerals and descriptions thereof are omitted.

The fourth underlayer 24 is disposed between the third underlayer 23 and the first ferromagnetic layer 30. The fourth underlayer 24 functions as a seed layer that improves the crystallinity of the first ferromagnetic layer 30 laminated on the underlayer 20. Regarding the material of the fourth underlayer 24, for example, an alloy containing Co and Fe can be used. It has been reported that the Heusler alloy constituting the first ferromagnetic layer 30 has low magnetization stability near the laminate interface. On the other hand, the alloy containing Co and Fe has high magnetization stability and has high lattice matching with the Heusler alloy constituting the first ferromagnetic layer 30. In the magnetoresistance effect element 103 using an alloy containing Co and Fe for the fourth underlayer 24, since the magnetization of the Heusler alloy constituting the first ferromagnetic layer 30 is more stable, the MR ratio is improved at room temperature. The alloy containing Co and Fe is, for example, Co—Fe or Co—Fe—B.

While embodiments of the disclosure have been described above in detail with reference to the drawings, components in the embodiments, combinations thereof, and the like are examples, and additions, omissions, substitutions, and other modifications of components can be made without departing from the spirit and scope of the disclosure.

For example, in the magnetoresistance effect elements 101, 102, and 103 according to the embodiments, both the first ferromagnetic layer 30 and the second ferromagnetic layer 70 are formed using a specific Heusler alloy, but the disclosure is not limited thereto. At least one of the first ferromagnetic layer 30 and the second ferromagnetic layer 70 may be formed using a specific Heusler alloy. In this case, the ferromagnetic material forming the other first ferromagnetic layer 30 or second ferromagnetic layer 70 is, for example, a metal selected from the group consisting of Cr, Mn, Co, Fe and Ni, an alloy containing one or more of these metals, or an alloy containing these metals and at least one element of B, C and N. Among these ferromagnetic materials, Co—Fe or Co—Fe—B is preferable.

In addition, in the magnetoresistance effect elements 101, 102, and 103 according to the embodiments, the non-magnetic layer 50 is a layer made of a non-magnetic metal, but the disclosure is not limited thereto. Regarding the material of the non-magnetic layer 50, an insulator or a semiconductor may be used.

In addition, the usage form of the magnetoresistance effect elements 101, 102, and 103 according to the embodiments is not limited to a current-perpendicular-to-plane-giant magnetic resistance element (CPP-GMR element). The magnetoresistance effect elements 101, 102, and 103 can be used as, for example, a current-in-plane-giant magnetic resistance element (CIP-GMR element) that exhibits a magnetoresistance effect by causing a current to flow through the magnetoresistance effect element 101 in the lamination surface direction. The magnetoresistance effect elements 101, 102, and 103 according to the embodiments can be applied to, for example, a magnetic head, a magnetic sensor, a magnetic memory, a high-frequency filter, or the like.

Next, application examples of the magnetoresistance effect element according to the present embodiment will be described. Here, in the following application examples, the magnetoresistance effect element 101 of the first embodiment is used as the magnetoresistance effect element, but the magnetoresistance effect element is not limited thereto, and for example, the same effects can be obtained using the magnetoresistance effect element 102 of the second embodiment and the magnetoresistance effect element 103 of the third embodiment.

Figure 5:
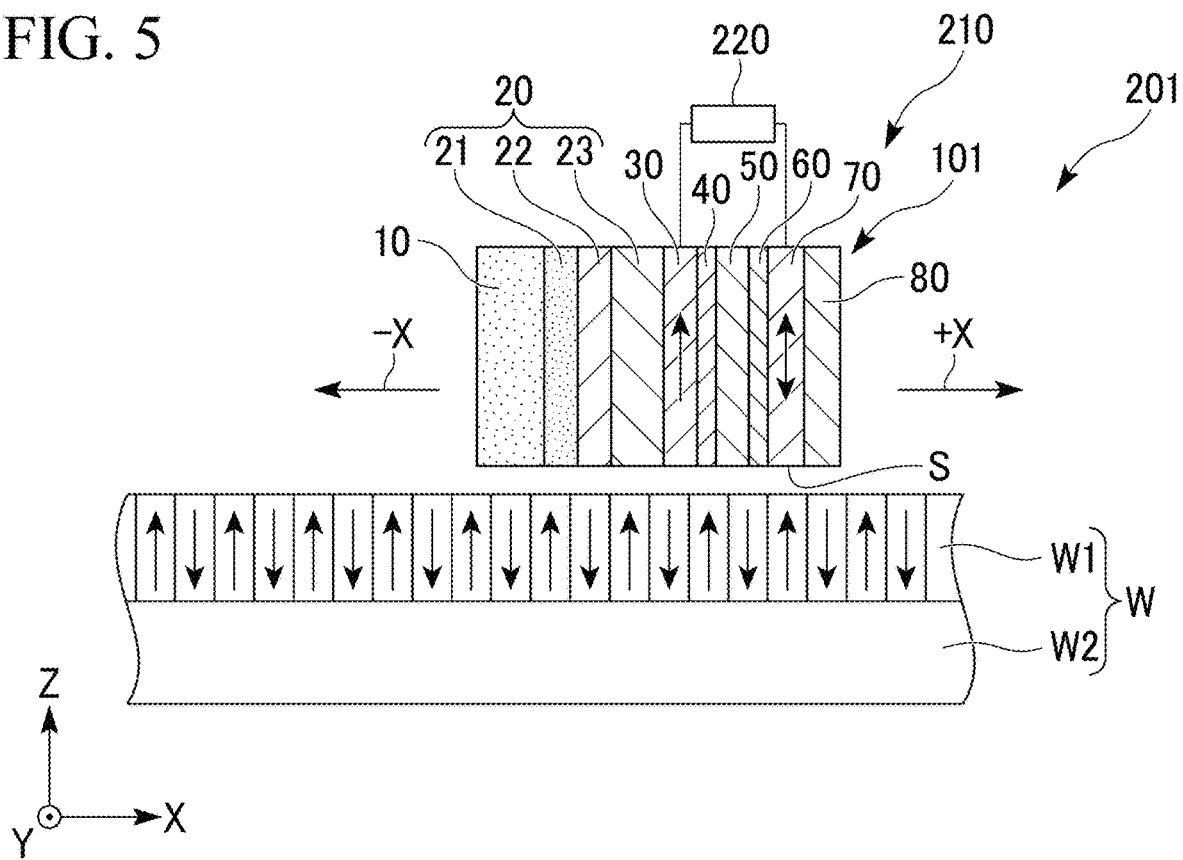
FIG. 5 is a cross-sectional view of a magnetic recording device according to Application Example 1.

FIG. 5 is a cross-sectional view of a magnetic recording device according to Application Example 1. FIG. 5 is a cross-sectional view of the magnetoresistance effect element 101 cut in the lamination direction of respective layers of the magnetoresistance effect element.

As shown in FIG. 5, a magnetic recording device 201 includes a magnetic head 210 and a magnetic recording medium W. Here, in FIG. 5, one direction in which the magnetic recording medium W extends is defined as an X direction, a direction perpendicular to the X direction is defined as a Y direction, and the XY plane is parallel to the main surface of the magnetic recording medium W. In addition, a direction in which the magnetic recording medium W is connected to the magnetic head 210 and is perpendicular to the XY plane is defined as a Z direction.

An air-bearing surface (medium facing surface) S faces the surface of the magnetic recording medium W, and at a position a certain distance away from the magnetic recording medium W, along the surface of the magnetic recording medium W, the magnetic head 210 can travel in directions of an arrow +X and arrow −X. The magnetic head 210 includes the magnetoresistance effect element 101 that functions as a magnetic sensor and a magnetic recording unit (not shown). A resistance-measuring device 220 is connected to the first ferromagnetic layer 30 and the second ferromagnetic layer 70 of the magnetoresistance effect element 101.

The magnetic recording unit applies a magnetic field to a recording layer W1 of the magnetic recording medium W and determines the magnetization direction of the recording layer W1. That is, the magnetic recording unit performs magnetic recording of the magnetic recording medium W. The magnetoresistance effect element 101 reads information on the magnetization of the recording layer W1 written by the magnetic recording unit.

The magnetic recording medium W includes the recording layer W1 and a backing layer W2. The recording layer W1 is a part in which magnetic recording is performed and the backing layer W2 is magnetic path (magnetic flux path) in which a magnetic flux for writing is returned again to the magnetic head 210. In the recording layer W1, the magnetic information is recorded as the magnetization direction.

The second ferromagnetic layer 70 of the magnetoresistance effect element 101 is a magnetization free layer. Therefore, the second ferromagnetic layer 70 exposed on the air-bearing surface S is influenced by the magnetization recorded in the facing recording layer W1 of the magnetic recording medium W. For example, in FIG. 5, the magnetization direction of the second ferromagnetic layer 70 is oriented in the +z direction under the influence of the magnetization oriented in the +z direction of the recording layer W1. In this case, the magnetization directions of the first ferromagnetic layer 30 and the second ferromagnetic layer 70, which are magnetization fixed layers, are parallel to each other.

Here, the resistance when the magnetization directions of the first ferromagnetic layer 30 and the second ferromagnetic layer 70 are parallel to each other is different from the resistance when the magnetization directions of the first ferromagnetic layer 30 and the second ferromagnetic layer 70 are antiparallel. Therefore, when the resistances of the first ferromagnetic layer 30 and the second ferromagnetic layer 70 are measured by the resistance-measuring device 220, the information on the magnetization of the recording layer W1 can be read as a resistance value change.

Here, the shape of the magnetoresistance effect element 101 of the magnetic head 210 is not particularly limited. For example, in order to avoid the influence of a leakage magnetic field of the magnetic recording medium W with respect to the first ferromagnetic layer 30 of the magnetoresistance effect element 101, the first ferromagnetic layer 30 may be provided at a position away from the magnetic recording medium W.

Figure 6:
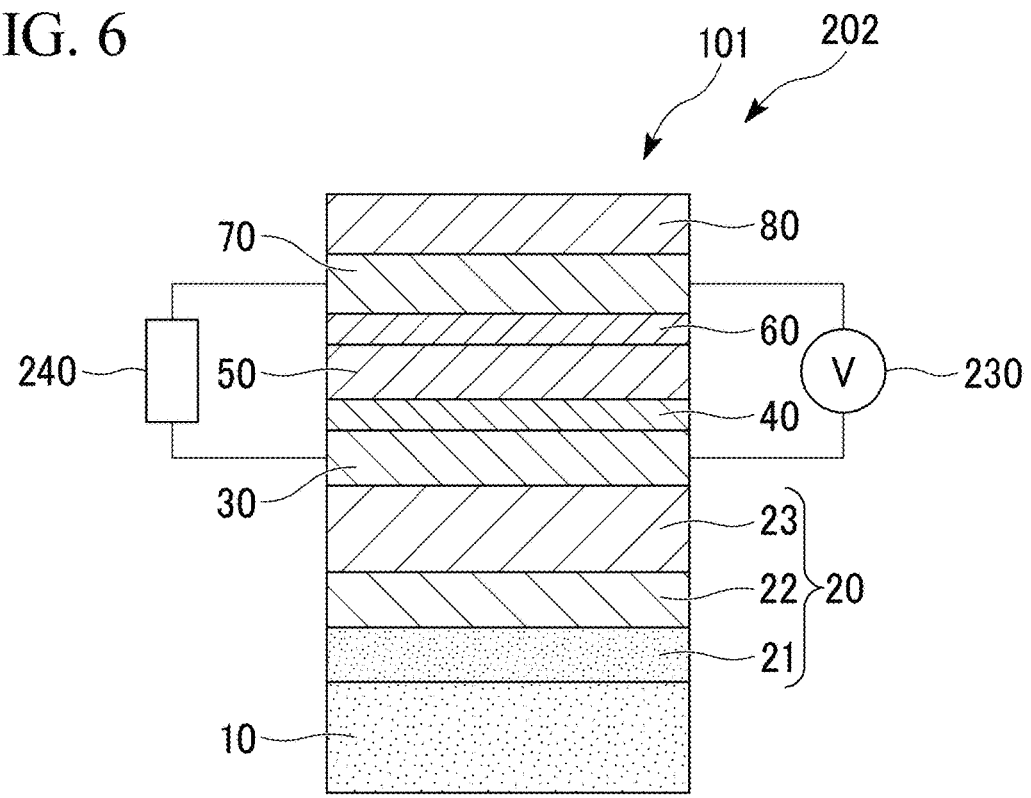
FIG. 6 is a cross-sectional view of a magnetic recording element according to Application Example 2.

FIG. 6 is a cross-sectional view of a magnetic recording element according to Application Example 2. FIG. 6 is a cross-sectional view of the magnetoresistance effect element 101 cut in the lamination direction of respective layers of the magnetoresistance effect element.

As shown in FIG. 6, a magnetic recording element 202 includes the magnetoresistance effect element 101, and a power supply 230 and a measurement unit 240 connected to the first ferromagnetic layer 30 and the second ferromagnetic layer 70 of the magnetoresistance effect element 101.

When the third underlayer 23 of the underlayer 20 has conductivity, the power supply 230 and the measurement unit 240 may be connected to the third underlayer 23 instead of the first ferromagnetic layer 30. In addition, when the cap layer 80 has conductivity, the power supply 230 and the measurement unit 240 may be connected to the cap layer 80 instead of the second ferromagnetic layer 70. The power supply 230 provides a potential difference in the lamination direction of the magnetoresistance effect element 101. The measurement unit 240 measures the resistance value of the magnetoresistance effect element 101 in the lamination direction.

When a potential difference is generated between the first ferromagnetic layer 30 and the second ferromagnetic layer 70 by the power supply 230, a current flows in the lamination direction of the magnetoresistance effect element 101. When the current is spin-polarized while passing through the first ferromagnetic layer 30, it becomes a spin-polarized current. The spin-polarized current reaches the second ferromagnetic layer 70 with the non-magnetic layer 50 therebetween. The magnetization of the second ferromagnetic layer 70 receives a spin-transfer torque (STT) due to the spin-polarized current and the magnetization is reversed. When a relative angle between the magnetization direction of the first ferromagnetic layer 30 and the magnetization direction of the second ferromagnetic layer 70 is changed, the resistance value of the magnetoresistance effect element 101 in the lamination direction changes. The resistance value of the magnetoresistance effect element 101 in the lamination direction is read by the measurement unit 240. That is, the magnetic recording element 202 shown in FIG. 6 is a spin-transfer torque (STT) type magnetic recording element.

Figure 7:
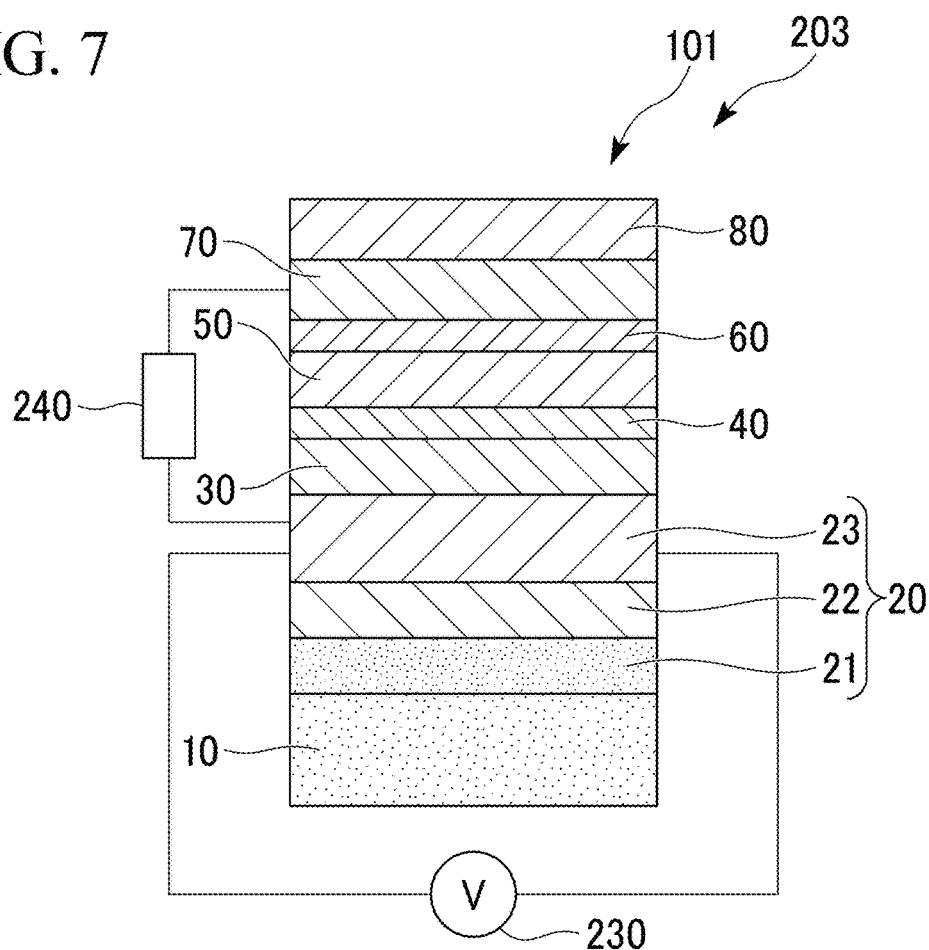
FIG. 7 is a cross-sectional view of a magnetic recording element according to Application Example 3.

FIG. 7 is a cross-sectional view of a magnetic recording element according to Application Example 3. FIG. 7 is a cross-sectional view of the magnetoresistance effect element 101 cut in the lamination direction of respective layers of the magnetoresistance effect element.

As shown in FIG. 7, a magnetic recording element 203 includes the magnetoresistance effect element 101, the power supply 230 connected to both ends of the third underlayer 23 of the magnetoresistance effect element 101, and the measurement unit 240 connected to the third underlayer 23 and the second ferromagnetic layer 70. The third underlayer 23 is a layer containing any of a metal having a function of generating a spin current due to a spin Hall effect when a current flows, an alloy, an intermetallic compound, a metal boride, a metal carbide, a metal silicide, and a metal phosphide. For example, the third underlayer 23 is a layer containing a non-magnetic metal including d electrons or f electrons in the outmost shell and having an atomic number of 39 or more. In addition, when the cap layer 80 has conductivity, the measurement unit 240 may be connected to the cap layer 80 instead of the second ferromagnetic layer 70. The power supply 230 is connected to a first end and a second end of the third underlayer 23. The power supply 230 provides a potential difference in the in-plane direction between one end (first end) of the third underlayer 23 and the end (second end) opposite to the first end. The measurement unit 240 measures the resistance value of the magnetoresistance effect element 101 in the lamination direction. In the magnetoresistance effect element 101 shown in FIG. 7, the first ferromagnetic layer 30 is a magnetization free layer, and the second ferromagnetic layer 70 is a magnetization fixed layer.

When a potential difference is generated between the first end and the second end of the third underlayer 23 by the power supply 230, a current flows through the third underlayer 23. When a current flows through the third underlayer 23, the spin Hall effect occurs due to the spin-orbit interaction. The spin Hall effect is a phenomenon in which moving spins are bent in the direction perpendicular to the direction in which a current flows. According to the spin Hall effect, an uneven distribution of spins in the third underlayer 23 is produced and a spin current is induced in the thickness direction of the third underlayer 23. Spins are injected from the third underlayer 23 to the first ferromagnetic layer 30 by the spin current.

Spins injected into the first ferromagnetic layer 30 provide a spin orbit torque (SOT) to the magnetization of the first ferromagnetic layer 30. The first ferromagnetic layer 30 receives the spin orbit torque (SOT) and reverses the magnetization. When the magnetization direction of the first ferromagnetic layer 30 and the magnetization direction of the second ferromagnetic layer 70 change, the resistance value of the magnetoresistance effect element 101 in the lamination direction changes. The resistance value of the magnetoresistance effect element 101 in the lamination direction is read by the measurement unit 240. That is, the magnetic recording element 203 shown in FIG. 7 is a spin orbit torque (SOT) type magnetic recording element.

While the magnetoresistance effect element of the present embodiment has been described above, the application of the Heusler alloy according to the present embodiment represented by the above General Formula (1) is not limited to the magnetoresistance effect element. The Heusler alloy of the present embodiment can be applied as a material for, for example, a ferromagnetic layer of a spin current magnetization rotating element or a magnetic layer having a magnetic domain wall of a magnetic domain wall-moving element.

[Spin Current Magnetization Rotating Element]

Figure 8:
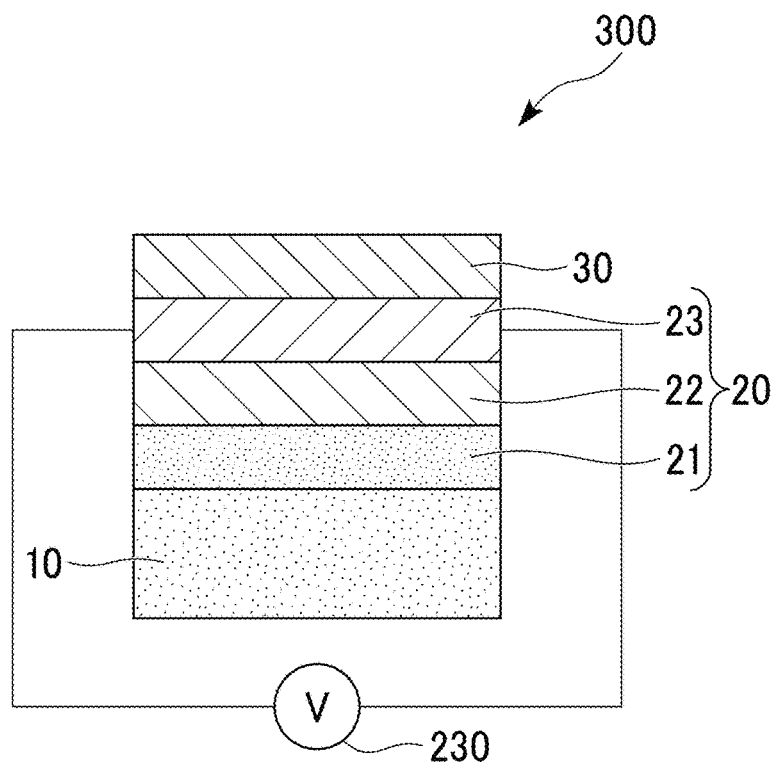
FIG. 8 is a cross-sectional view of a spin current magnetization rotating element according to Application Example 4.

FIG. 8 is a cross-sectional view of a spin current magnetization rotating element according to Application Example 4.

A spin current magnetization rotating element 300 is obtained by removing the first NiAl layer 40, the non-magnetic layer 50, the second NiAl layer 60, the second ferromagnetic layer 70 and the cap layer 80 from the magnetic recording element 203 shown in FIG. 7. In the spin current magnetization rotating element 300, the first ferromagnetic layer 30 is made of the Heusler alloy represented by the above General Formula (1).

When a potential difference is generated between the first end and the second end of the third underlayer 23 by the power supply 230, a current flows through the third underlayer 23. When a current flows through the third underlayer 23, the spin Hall effect occurs due to the spin-orbit interaction. Spins injected from the third underlayer 23 provide a spin orbit torque (SOT) to the magnetization of the first ferromagnetic layer 30. The magnetization direction of the magnetization of the first ferromagnetic layer 30 changes due to the spin orbit torque (SOT).

When the magnetization direction of the first ferromagnetic layer 30 changes, polarization of reflected light changes due to the magnetic Kerr effect. In addition, when the magnetization direction of the first ferromagnetic layer 30 changes, polarization of transmitted light changes due to the magnetic Faraday effect. The spin current magnetization rotating element 300 can be used as an optical element using the magnetic Kerr effect or the magnetic Faraday effect.

[Magnetic Domain Wall-Moving Element (Magnetic Domain Wall-Moving Type Magnetic Recording Element)]

Figure 9:
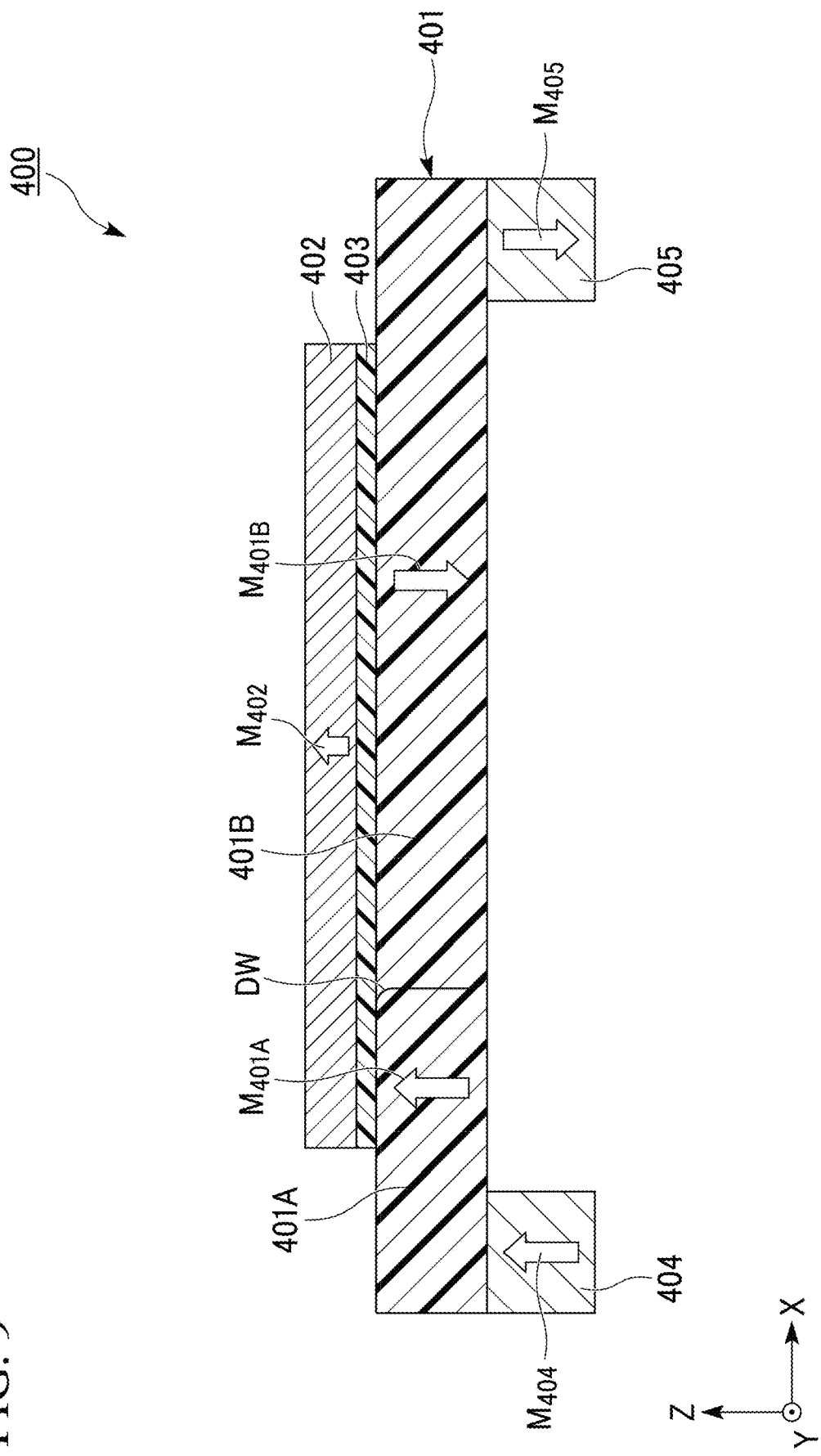
FIG. 9 is a cross-sectional view of a magnetic domain wall-moving element according to Application Example 5.

FIG. 9 is a cross-sectional view of a magnetic domain wall-moving element (magnetic domain wall-moving type magnetic recording element) according to Application Example 5. A magnetic domain wall-moving type magnetic recording element 400 includes a first ferromagnetic layer 401, a second ferromagnetic layer 402, a non-magnetic layer 403, a first magnetization fixed layer 404, and a second magnetization fixed layer 405. Here, in FIG. 9, a direction in which the first ferromagnetic layer 401 extends is defined as an X direction, a direction perpendicular to the X direction is defined as a Y direction, and a direction perpendicular to the XY plane is defined as a Z direction.

The non-magnetic layer 403 is inserted between the first ferromagnetic layer 401 and the second ferromagnetic layer 402 in the Z direction. The first magnetization fixed layer 404 and the second magnetization fixed layer 405 are connected to the first ferromagnetic layer 401 at a position between the second ferromagnetic layer 402 and the non-magnetic layer 403 in the X direction.

The first ferromagnetic layer 401 is a layer in which information can be magnetically recorded according to the change in the internal magnetic state. The first ferromagnetic layer 401 includes a first magnetic domain 401A and a second magnetic domain 401B therein. The magnetization of the first ferromagnetic layer 401 at a position overlapping the first magnetization fixed layer 404 or the second magnetization fixed layer 405 in the Z direction is fixed in one direction. The magnetization at a position overlapping the first magnetization fixed layer 404 in the Z direction is, for example, fixed in the +Z direction, and the magnetization at a position overlapping the second magnetization fixed layer 405 in the Z direction is, for example, fixed in the −Z direction. As a result, a magnetic domain wall DW is formed at the boundary between the first magnetic domain 401A and the second magnetic domain 401B. The first ferromagnetic layer 401 can have the magnetic domain wall DW therein. In the first ferromagnetic layer 401 shown in FIG. 9, the magnetization $M_{401A}$ of the first magnetic domain 401A is oriented in the +Z direction, and the magnetization $M_{401B}$ of the second magnetic domain 401B is oriented in the −Z direction.

The magnetic domain wall-moving type magnetic recording element 400 can record data in multiple values or continuously depending on the position of the magnetic domain wall DW of the first ferromagnetic layer 401. The data recorded in the first ferromagnetic layer 401 is read as a resistance value change of the magnetic domain wall-moving type magnetic recording element 400 when a read current is applied.

The ratio between the first magnetic domain 401A and the second magnetic domain 401B in the first ferromagnetic layer 401 changes when the magnetic domain wall DW moves. For example, the magnetization $M_{402}$ of the second ferromagnetic layer 402 has the same direction (parallel) as the magnetization $M_{401A}$ of the first magnetic domain 401A and has a direction (antiparallel) opposite to that of the magnetization $M_{401B}$ of the second magnetic domain 401B. When the magnetic domain wall DW moves in the +X direction and an area of the first magnetic domain 401A in the part overlapping the second ferromagnetic layer 402 in a plan view in the z direction increases, the resistance value of the magnetic domain wall-moving type magnetic recording element 400 decreases. On the other hand, when the magnetic domain wall DW moves in the −X direction and an area of the second magnetic domain 401B in the part overlapping the second ferromagnetic layer 402 in a plan view in the Z direction increases, the resistance value of the magnetic domain wall-moving type magnetic recording element 400 increases.

The magnetic domain wall DW moves when a write current flows in the X direction of the first ferromagnetic layer 401 or an external magnetic field is applied. For example, when a write current (for example, current pulse) is applied to the first ferromagnetic layer 401 in the +X direction, since electrons flow in the −X direction opposite to the direction of the current, the magnetic domain wall DW moves in the −X direction. When a current flows from the first magnetic domain 401A toward the second magnetic domain 401B, electrons spin-polarized in the second magnetic domain 401B reverse the magnetization $M_{401A}$ of the first magnetic domain 401A. When the magnetization $M_{401A}$ of the first magnetic domain 401A is reversed, the magnetic domain wall DW moves in the −X direction.

The magnetic domain wall-moving type magnetic recording element 400 preferably has a large MR ratio and a large RA. When the MR ratio of the magnetic domain wall-moving type magnetic recording element 400 is large, a difference between the maximum value and the minimum value of the resistance value of the magnetic domain wall-moving type magnetic recording element 400 increases and the reliability of data increases. In addition, when the RA of the magnetic domain wall-moving type magnetic recording element 400 increases, the moving speed of the magnetic domain wall DW becomes slower and data can be recorded in an analog manner.

Regarding the material of the first ferromagnetic layer 401, for example, the Heusler alloy represented by the above General Formula (1) is used. As described above, the magnetoresistance effect element using the Heusler alloy represented by the above General Formula (1) has a large MR ratio and a large RA. Regarding the material of the first ferromagnetic layer 401, when the Heusler alloy represented by the above General Formula (1) is used, it is possible to increase the MR ratio and RA of the magnetic domain wall-moving type magnetic recording element 400.

For the second ferromagnetic layer 402, for example, a metal selected from the group consisting of Cr, Mn, Co, Fe and Ni, an alloy containing one or more of these metals, an alloy containing these metals and at least one element of B, C, and N, or the like can be used. Specifically, Co—Fe, Co—Fe—B, and Ni—Fe may be exemplified. Regarding the material of the second ferromagnetic layer 402, the Heusler alloy represented by the above General Formula (1) may be used.

For the non-magnetic layer 403, the same material as that of the non-magnetic layer 50 can be used. For the first magnetization fixed layer 404 and the second magnetization fixed layer 405, the same material as that of the second ferromagnetic layer 402 can be used. The first magnetization fixed layer 404 and the second magnetization fixed layer 405 may have an SAF structure.

[Magnetic Domain Wall-Moving Element (Magnetic Thin Wire Device)]

Figure 10:
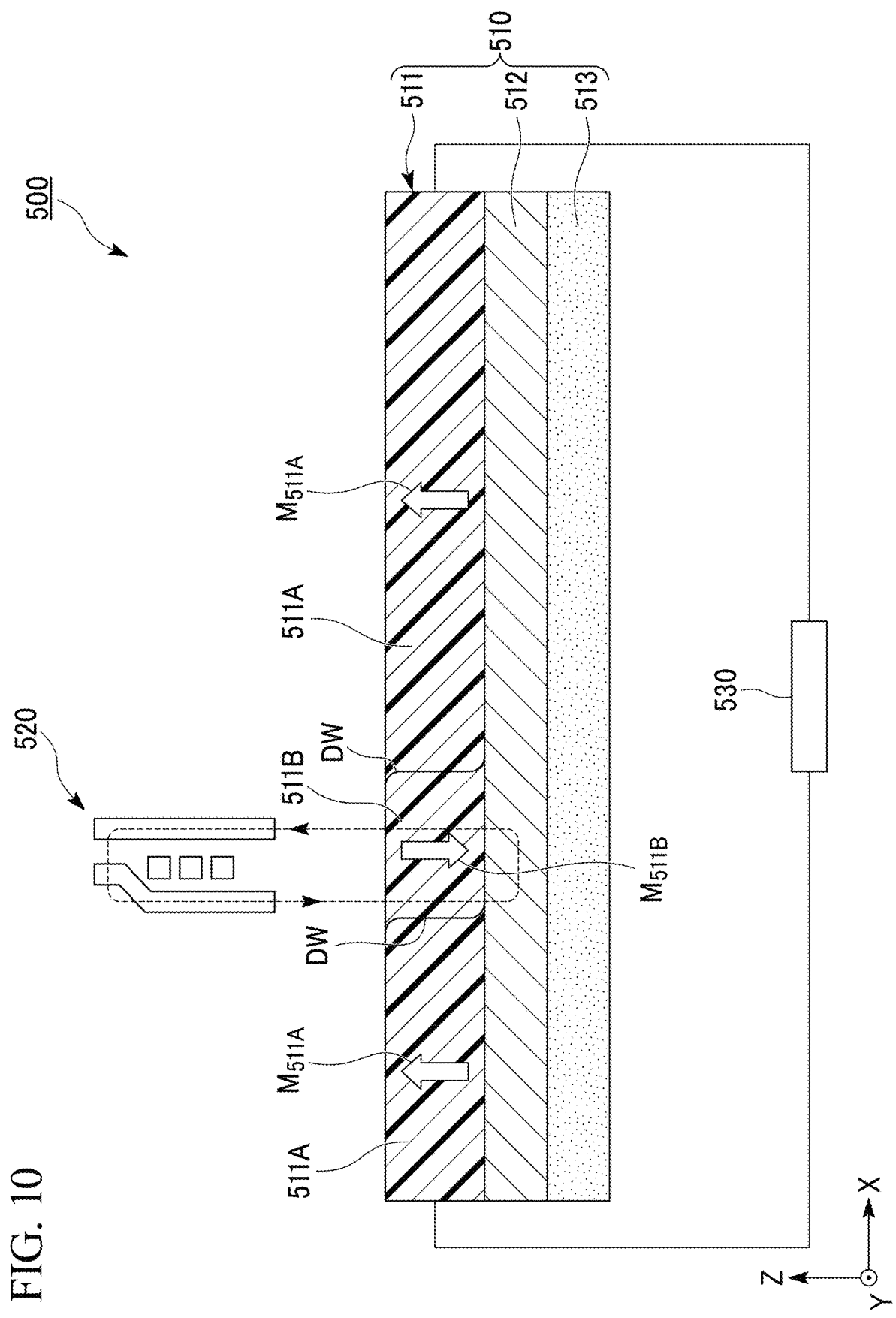
FIG. 10 is a cross-sectional view of a magnetic domain wall-moving element according to Application Example 6.

FIG. 10 is a cross-sectional view of a magnetic domain wall-moving element (magnetic thin wire device) according to Application Example 6.

As shown in FIG. 10, a magnetic thin wire device 500 includes a magnetic recording medium 510, a magnetic recording head 520, and a pulse power supply 530. The magnetic recording head 520 is provided at a predetermined position on the magnetic recording medium 510. The pulse power supply 530 is connected to the magnetic recording medium 510 so that a pulse current can be applied to the magnetic recording medium 510 in the in-plane direction. Here, in FIG. 10, one direction in which the magnetic recording medium 510 extends is defined as an X direction, a direction perpendicular to the X direction is defined as a Y direction, and a direction perpendicular to the XY plane is defined as a Z direction.

The magnetic recording medium 510 includes a magnetic thin wire 511, an underlayer 512 and a substrate 513. The underlayer 512 is laminated on the substrate 513 and the magnetic thin wire 511 is laminated on the underlayer 512. The magnetic thin wire 511 is a thin wire whose length in the X direction is longer than the width in the Y direction.

The magnetic thin wire 511 is formed of a magnetic material that can form a magnetic domain having a magnetization direction different from that of the other part in a part in the longitudinal direction. The magnetic thin wire 511 includes, for example, a first magnetic domain 511A and a second magnetic domain 511B. The magnetization $M_{511B}$ of the second magnetic domain 511B is oriented in a direction different from the magnetization $M_{511A}$ of the first magnetic domain 511A. The magnetic domain wall DW is formed between the first magnetic domain 511A and the second magnetic domain 511B. The second magnetic domain 511B is generated by the magnetic recording head 520.

The magnetic thin wire device 500 writes data by changing the position of the second magnetic domain 511B of the magnetic thin wire 511 using a magnetic field generated from the magnetic recording head 520 or spin injection magnetization reversal while intermittently shifting and moving the magnetic domain wall DW of the magnetic thin wire 511 by a pulse current supplied from the pulse power supply 530. The data written in the magnetic thin wire device 500 can be read using the magnetic resistance change or magneto-optical change. When the magnetic resistance change is used, a ferromagnetic layer is provided at a position facing the magnetic thin wire 511 with a non-magnetic layer therebetween. The magnetic resistance change occurs due to a difference in relative angle between the magnetization of the ferromagnetic layer and the magnetization of the magnetic thin wire 511.

Regarding the material of the magnetic thin wire 511, the Heusler alloy represented by the above General Formula (1) is used. Therefore, it is possible to increase the RA of the magnetic thin wire device 500.

Regarding the material of the underlayer 512, it is preferable to use a ferrite, which is an oxide insulator, in at least a part, and more specifically, a soft ferrite. Regarding the soft ferrite, Mn—Zn ferrite, Ni—Zn ferrite, Mn—Ni ferrite, or Ni—Zn—Co ferrite can be used. Since the soft ferrite has high magnetic permeability, a magnetic flux of a magnetic field generated by the magnetic recording head 520 is concentrated, and thus the second magnetic domain 511B can be formed efficiently. For the substrate 513, the same material as that of the above substrate 10 can be used.

[Magnetic Domain Wall-Moving Element (Magnetic Domain Wall-Moving Type Spatial Optical Modulator)]

Figure 11:
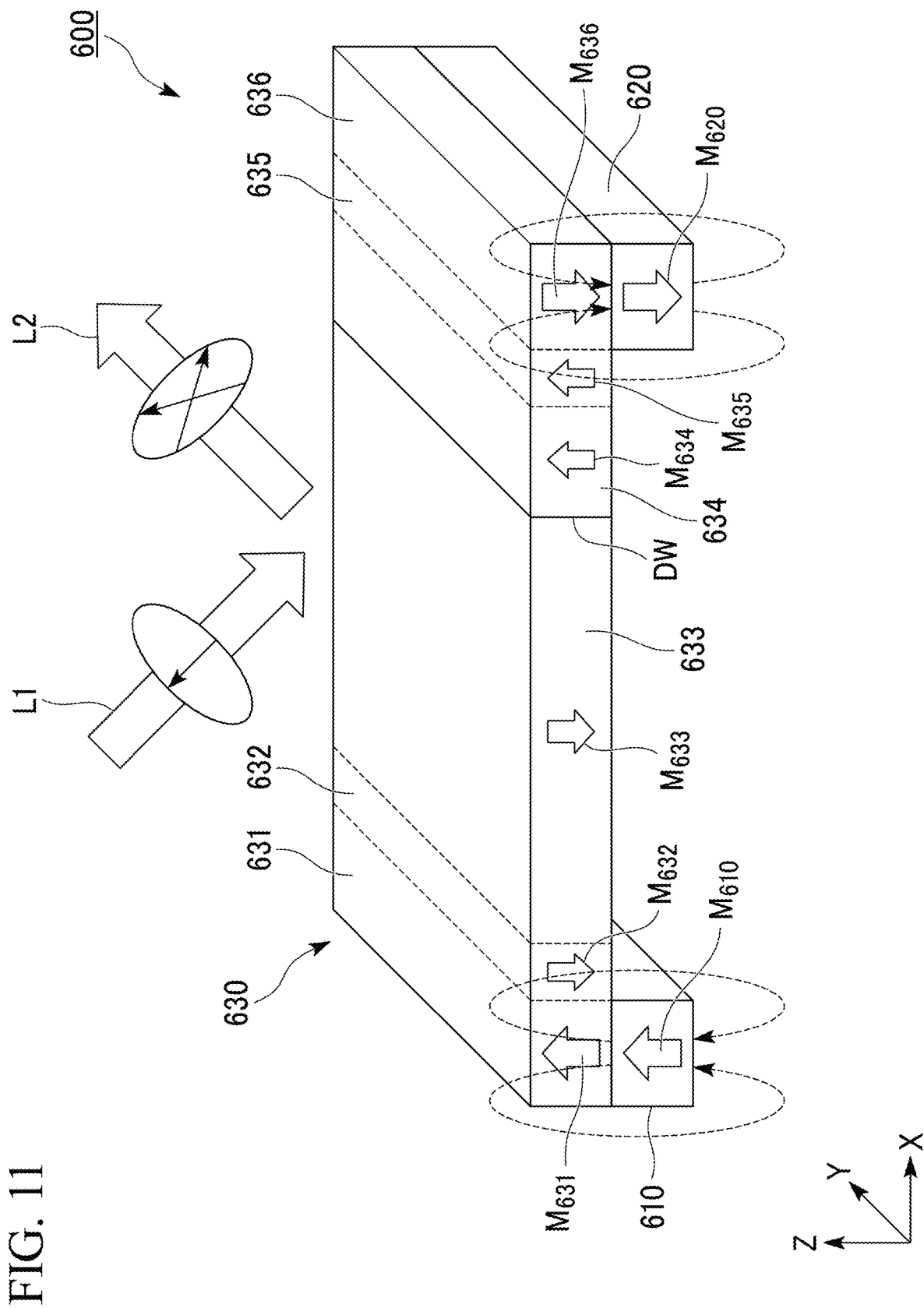
FIG. 11 is a cross-sectional view of a magnetic domain wall-moving element according to Application Example 7.

FIG. 11 is a perspective view of a magnetic domain wall-moving element (magnetic domain wall-moving type spatial optical modulator) according to Application Example 7.

As shown in FIG. 11, a magnetic domain wall-moving type spatial optical modulator 600 includes a first magnetization fixed layer 610, a second magnetization fixed layer 620, and a light-modulation layer 630. Here, in FIG. 11, one direction in which the light-modulation layer 630 extends is defined as an X direction, a direction perpendicular to the X direction is defined as a Y direction, and a direction perpendicular to the XY plane is defined as a Z direction.

The magnetization $M_{610}$ of the first magnetization fixed layer 610 and the magnetization $M_{620}$ of the second magnetization fixed layer 620 are oriented in different directions. For example, the magnetization $M_{610}$ of the first magnetization fixed layer 610 is oriented in the +Z direction, and the magnetization $M_{620}$ of the second magnetization fixed layer 620 is oriented in the −Z direction.

The light-modulation layer 630 can be divided into overlapping areas 631 and 636, initial magnetic domain areas 632 and 635, and magnetic domain change areas 633 and 634.

The overlapping area 631 is an area overlapping the first magnetization fixed layer 610 in the Z direction, and the overlapping area 636 is an area overlapping the second magnetization fixed layer 620 in the Z direction. The magnetization $M_{631}$ of the overlapping area 631 is influenced by the leakage magnetic field from the first magnetization fixed layer 610 and is fixed, for example, in the +Z direction. The magnetization $M_{636}$ of the overlapping area 636 is influenced by the leakage magnetic field from the second magnetization fixed layer 620 and is fixed, for example, in the −Z direction.

The initial magnetic domain areas 632 and 635 are areas in which the magnetization is fixed in a direction different from that of the overlapping areas 631 and 636 under the influence of the leakage magnetic field from the first magnetization fixed layer 610 or the second magnetization fixed layer 620. The magnetization $M_{632}$ of the initial magnetic domain area 632 is influenced by the leakage magnetic field from the first magnetization fixed layer 610 and is fixed, for example, in the −Z direction. The magnetization $M_{635}$ of the initial magnetic domain area 635 is influenced by the leakage magnetic field from the second magnetization fixed layer 620 and is fixed, for example, in the +Z direction.

The magnetic domain change areas 633 and 634 are areas in which the magnetic domain wall DW can move. The magnetization $M_{633}$ of the magnetic domain change area 633 and the magnetization $M_{634}$ of the magnetic domain change area 634 are oriented in opposite directions with the magnetic domain wall DW therebetween. The magnetization $M_{633}$ of the magnetic domain change area 633 is influenced by the initial magnetic domain area 632 and oriented, for example, in the −Z direction. The magnetization $M_{634}$ of the magnetic domain change area 634 is influenced by the leakage magnetic field from the initial magnetic domain area 635 and is fixed, for example, in the +Z direction. The boundary between the magnetic domain change area 633 and the magnetic domain change area 634 becomes the magnetic domain wall DW. The magnetic domain wall DW moves when a write current flows through the light-modulation layer 630 in the X direction or an external magnetic field is applied.

The magnetic domain wall-moving type spatial optical modulator 600 changes the position of the magnetic domain wall DW while moving the magnetic domain wall DW intermittently. Then, light L1 is caused to be incident on the light-modulation layer 630 and light L2 reflected by the light-modulation layer 630 is evaluated. The polarization state of the light L2 reflected by parts having different magnetization orientation directions differs. The magnetic domain wall-moving type spatial optical modulator 600 can be used as a video display device that uses a difference in polarization state of the light L2.

Regarding the material of the light-modulation layer 630, the Heusler alloy represented by the above General Formula (1) is used. Accordingly, it is possible to increase the RA of the magnetic domain wall-moving type spatial optical modulator 600, and the moving speed of the magnetic domain wall DW can be reduced. As a result, the position of the magnetic domain wall DW can be controlled more precisely and higher-definition video display is possible.

For the first magnetization fixed layer 610 and the second magnetization fixed layer 620, the same material as that of the above first magnetization fixed layer 404 and second magnetization fixed layer 405 can be used.

EXAMPLES

Example 1

The magnetoresistance effect element 101 shown in FIG. 1 was produced as follows. The configurations of respective layers were as follows.
Substrate 10: MgO single crystal substrate, thickness of 0.5 mm
Underlayer 20:
First underlayer 21: MgO layer, thickness of 10 nm
Second underlayer 22: CoFe layer, thickness of 10 nm
Third underlayer 23: Ag layer, thickness of 100 nm
First ferromagnetic layer 30: $Co_2Fe_{1.03}Ga_{0.41}Ge_{0.86}$ layer, thickness of 10 nm
First NiAl layer 40: thickness of 0.21 nm
Non-magnetic layer 50: Ag layer, thickness of 5 nm
Second NiAl layer 60: thickness of 0.21 nm
Second ferromagnetic layer 70: $Co_2Fe_{1.03}Ga_{0.41}Ge_{0.86}$ layer, thickness of 8 nm
Cap layer 80: Ru layer, thickness of 5 nm The first underlayer 21 (MgO layer) was formed by heating the substrate 10 at 600° C. using an electron beam vapor deposition method. The substrate on which the first underlayer 21 was formed was left at 600° C. for 15 minutes and then cooled to room temperature. Next, the second underlayer 22 (CoFe layer) was formed on the first underlayer 21 by a sputtering method. Next, the third underlayer 23 (Ag layer) was formed on the second underlayer 22 by a sputtering method to form the underlayer 20. The substrate 10 on which the underlayer 20 was formed was heated at 300° C. for 15 minutes, and then cooled to room temperature.

After cooling, the first ferromagnetic layer 30 ($Co_2Fe_{1.03}Ga_{0.41}Ge_{0.86}$ layer) was formed on the underlayer 20 formed on the substrate 10. The first ferromagnetic layer 30 was formed by a co-sputtering method using a $Co_2Fe_1Ga_{0.5}Ge_{0.5}$ alloy target and a Ge target as targets.

The first NiAl layer 40 was formed on the first ferromagnetic layer 30 by a sputtering method. Next, the non-magnetic layer 50 (Ag layer) was formed on the first NiAl layer 40 by a sputtering method. Next, the second NiAl layer 60 was formed on the non-magnetic layer 50 in the same manner as that in the first NiAl layer 40. Then, the second ferromagnetic layer 70 ($Co_2Fe_{1.03}Ga_{0.41}Ge_{0.86}$ layer) was formed on the second NiAl layer 60 in the same manner as that in the first ferromagnetic layer 30. The substrate 10 on which the second ferromagnetic layer 70 was formed was heated at 550° C. for 15 minutes, and then cooled to room temperature.

After cooling, the cap layer 80 (Ru layer) was formed on the second ferromagnetic layer 70 formed on the substrate 10 by an electron beam vapor deposition method. Thus, the magnetoresistance effect element 101 shown in FIG. 1 was produced.

Examples 2 and 3 and Comparative Example 1

The magnetoresistance effect element 101 was produced in the same manner as that in Example 1 except that the compositions of the first ferromagnetic layer 30 and the second ferromagnetic layer 70 were changed to the composition shown in the following Table 1. Here, the compositions of the first ferromagnetic layer 30 and the second ferromagnetic layer 70 were adjusted by a co-sputtering method using a Ge target.
(Evaluation)

The MR ratio (Magnetoresistance ratio) and RA (Resistance Area product) of the magnetoresistance effect elements produced in Examples 1 to 3 and Comparative Example 1 were measured. The results are shown in the following Table 1.

The MR ratio was evaluated using a microfabrication process technique such as EB lithography and ion milling, and a junction suitable for measurement was formed. When a constant current was applied to the junction of the magnetoresistance effect element 101 in the lamination direction, a voltage applied to the magnetoresistance effect element 101 was monitored using a voltmeter while sweeping the magnetic field to the magnetoresistance effect element 101 from the outside, and thus the change in the resistance value of the magnetoresistance effect element 101 was measured. A resistance value when the magnetization directions of the first ferromagnetic layer 30 and the second ferromagnetic layer 70 were parallel and a resistance value when the magnetization directions of the first ferromagnetic layer 30 and the second ferromagnetic layer 70 were antiparallel were measured, and the MR ratio was calculated from the obtained resistance values according to the following formula. The MR ratio was measured at 300 K (room temperature).

MR ratio (%)=$(R_{AP}-R_P)/R_P \times 100$ $R_P$ was a resistance value when the magnetization directions of the first ferromagnetic layer 30 and the second ferromagnetic layer 70 were parallel, and $R_{AP}$ was a resistance value when the magnetization directions of the first ferromagnetic layer 30 and the second ferromagnetic layer 70 were antiparallel.

RA was obtained by multiplying the resistance $R_P$ when the magnetization directions of the first ferromagnetic layer 30 and the second ferromagnetic layer 70 were parallel and the area A of the junction formed by microfabrication process.

TABLE 1

| | Composition of first ferromagnetic layer and second ferromagnetic layer (molar ratio) | | | | Total | Evaluation | |
|---|---|---|---|---|---|---|---|
| | | X component | | | content of Fe and X | RA (Ω · | MR |
| | Co | Fe | Ga | Ge | component | µm$^2$) | (%) |
| Example 1 | 2 | 1.03 | 0.41 | 0.86 | 2.30 | 0.045 | 25.0 |
| Example 2 | 2 | 1.03 | 0.41 | 0.87 | 2.31 | 0.050 | 29.8 |
| Example 3 | 2 | 1.03 | 0.41 | 1.06 | 2.50 | 0.103 | 55.6 |
| Comparative Example 1 | 2 | 1.03 | 0.41 | 0.56 | 2.00 | 0.017 | 19.3 |

Based on the results in Table 1, it was found that the magnetoresistance effect elements of Examples 1 to 3 in which the content α of Fe and the content β of the component X satisfied the scope of the disclosure had a larger value of RA and a larger MR ratio than the magnetoresistance effect element of Comparative Example 1 in which the content α of Fe and the content β of the component X were outside the scope of the disclosure.

Example 4

The magnetoresistance effect element 102 shown in FIG. 3 was produced in the same manner as that in Example 1 except that the first NiAl layer 40 and the second NiAl layer 60 were not provided.

Example 5 and Comparative Example 2

The magnetoresistance effect element 102 was produced in the same manner as that in Example 4 except that the compositions of the first ferromagnetic layer 30 and the second ferromagnetic layer 70 were changed to the composition shown in the following Table 2. Here, the compositions of the first ferromagnetic layer 30 and the second ferromagnetic layer 70 were adjusted by a co-sputtering method using a Ge target.
(Evaluation)

The MR ratio and RA of the magnetoresistance effect elements produced in Examples 4 and 5 and Comparative Example 2 were measured by the above methods. The results are shown in the following Table 2.

TABLE 2

| | Composition of first ferromagnetic layer and second ferromagnetic layer (molar ratio) | | | | Total | Evaluation | |
|---|---|---|---|---|---|---|---|
| | | X component | | | content of Fe and X | RA (Ω · | MR |
| | Co | Fe | Ga | Ge | component | µm$^2$) | (%) |
| Example 4 | 2 | 1.03 | 0.41 | 0.86 | 2.30 | 0.044 | 20.0 |
| Example 5 | 2 | 1.03 | 0.41 | 0.96 | 2.31 | 0.057 | 22.3 |
| Comparative Example 2 | 2 | 1.03 | 0.41 | 0.56 | 2.00 | 0.041 | 15.9 |

Based on the results in Table 2, it was found that, in the magnetoresistance effect element in which the first NiAl layer 40 and the second NiAl layer 60 were not provided, the magnetoresistance effect elements of Examples 4 and 5 in which the content α of Fe and the content β of the component X satisfied the scope of the disclosure had a larger value of RA and a larger MR ratio than the magnetoresistance effect element of Comparative Example 2 in which the content α of Fe and the content β of the component X were outside the scope of the disclosure.

Example 6

The magnetoresistance effect element 103 shown in FIG. 4 was produced in the same manner as that in Example 1 except that a CoFe layer having a thickness of 10 nm was provided as a fourth underlayer on the underlayer 20, the first ferromagnetic layer 30 and the second ferromagnetic layer 70 were a $Co_2Fe_{1.02}Ga_{0.40}Ge_{0.22}Mn_{0.76}$ layer, and the thickness of the second ferromagnetic layer 70 was set to 5 nm.

The first ferromagnetic layer 30 and the second ferromagnetic layer 70 were formed by a co-sputtering method using a $Co_2Fe_1Ga_{0.5}Ge_{0.5}$ alloy target and a Mn target as targets.

Comparative Example 3

The magnetoresistance effect element 103 was produced in the same manner as that in Example 6 except that the compositions of the first ferromagnetic layer 30 and the second ferromagnetic layer 70 were changed to the composition shown in the following Table 3. Here, the compositions of the first ferromagnetic layer 30 and the second ferromagnetic layer 70 were adjusted by a co-sputtering method using a Mn target.

(Evaluation)

The MR ratio and RA of the magnetoresistance effect elements produced in Example 6 and Comparative Example 3 were measured by the above methods. The results are shown in the following Table 3.

TABLE 3

| | Composition of first ferromagnetic layer and second ferromagnetic layer (molar ratio) | | | | | Total content of Fe and X component | Evaluation | |
|---|---|---|---|---|---|---|---|---|
| | | | X component | | | | RA ($\Omega \cdot \mu m^2$) | MR (%) |
| | Co | Fe | Ga | Ge | Mn | | | |
| Example 6 | 2 | 1.02 | 0.40 | 0.22 | 0.76 | 2.40 | 0.068 | 20.1 |
| Comparative Example 3 | 2 | 1.02 | 0.40 | 0.22 | 0.38 | 2.02 | 0.047 | 15.9 |

Based on the results in Table 3, it was found that, in the magnetoresistance effect element including the fourth underlayer 24, the magnetoresistance effect element of Example 6 in which the content α of Fe and the content β of the component X satisfied the scope of the disclosure had a larger value of RA and a larger MR ratio than the magnetoresistance effect element of Comparative Example 3 in which the content α of Fe and the content β of the component X were outside the scope of the disclosure.

Figure 12:
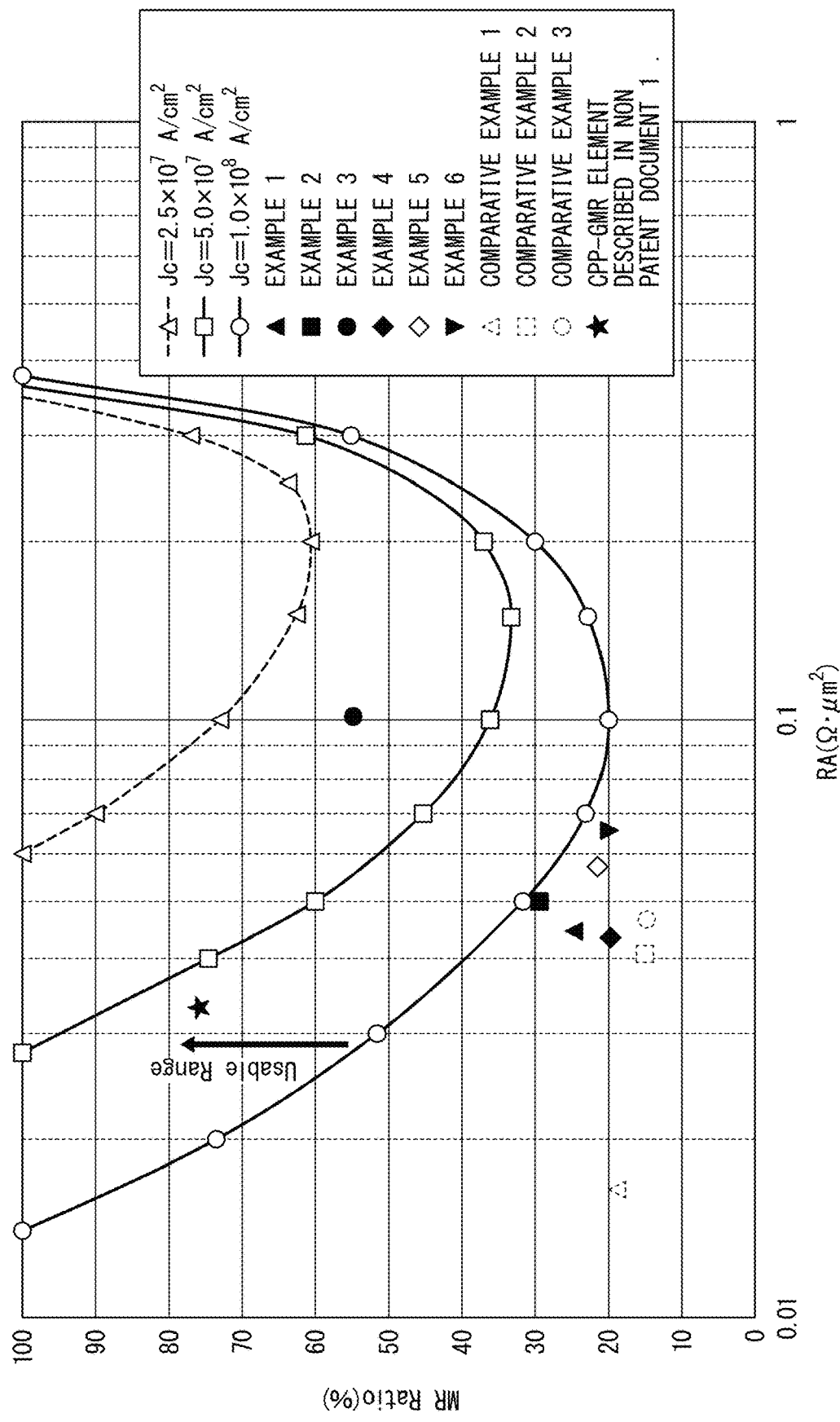
FIG. 12 is a graph in which the MR ratio and RA of magnetoresistance effect elements produced in Examples 1 to 6 and Comparative Examples 1 to 3 are plotted.

FIG. 12 shows a graph in which the MR ratio (Magnetoresistance ratio) and RA (Resistance Area product) of the magnetoresistance effect elements produced in Examples 1 to 6 and Comparative Examples 1 to 3 were plotted. In FIG. 12, the MR ratio and RA of the magnetoresistance effect elements produced in Examples 1 to 6 and Comparative Examples 1 to 3 and the CPP-GMR element described in Non-Patent Document 1 were plotted in the graph shown in FIG. 5 in Non-Patent Document 2.

Based on the graph in FIG. 12, it was found that the magnetoresistance effect elements obtained in Examples 1 to 6 had a larger MR ratio and RA than the magnetoresistance effect elements obtained in Comparative Examples 1 to 3. In particular, it was found that the magnetoresistance effect element obtained in Example 3 was able to be operated at a critical current density Jc of 2.5 to $5.0 \times 10^7$ A/cm$^2$.

Example 7

Figure 13:
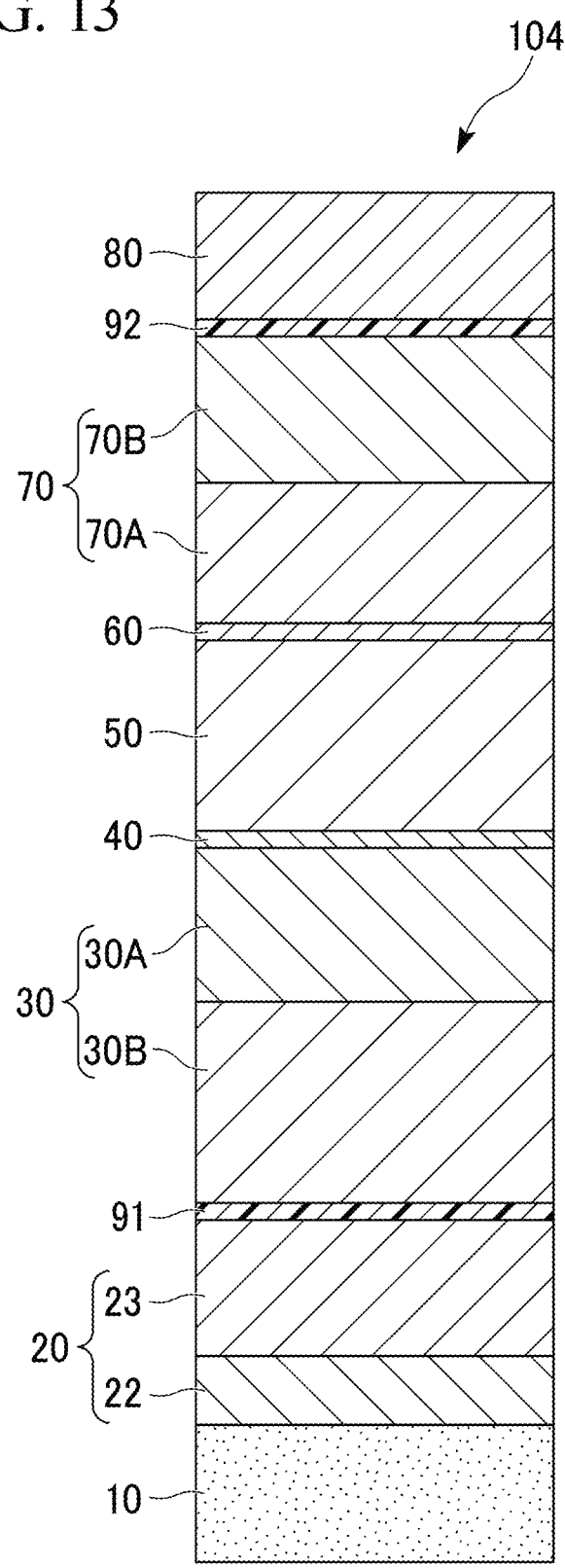
FIG. 13 is a cross-sectional view of a magnetoresistance effect element produced in Example 7.

A magnetoresistance effect element 104 shown in FIG. 13 was produced as follows. The configurations of respective layers of the magnetoresistance effect element 104 were as follows.

Substrate 10: MgO single crystal substrate, thickness of 0.5 mm
Underlayer 20:
Second underlayer 22: Cr layer, thickness of 10 nm
Third underlayer 23: Ag layer, thickness of 100 nm
First insertion layer 91: Ni layer, thickness of 0.21 nm
First ferromagnetic layer 30
Substrate-side first ferromagnetic layer 30B: $Co_2Fe_{1.03}Ga_{0.41}Ge_{0.86}$ layer, thickness of 7 nm
Non-magnetic layer-side first ferromagnetic layer 30A: $Co_2Fe_{1.13}Ga_{0.41}Ge_{0.76}$ layer, thickness of 3 nm
First NiAl layer 40: thickness of 0.21 nm
Non-magnetic layer 50: Ag layer, thickness of 5 nm
Second NiAl layer 60: thickness of 0.21 nm
Second ferromagnetic layer 70
Non-magnetic layer-side second ferromagnetic layer 70A: $Co_2Fe_{1.03}Ga_{0.41}Ge_{0.56}$ layer, thickness of 4 nm
Cap layer-side second ferromagnetic layer 70B: $Co_2Fe_{1.03}Ga_{0.41}Ge_{0.86}$ layer, thickness of 4 nm
Second insertion layer 92: Ni layer, thickness of 0.21 nm
Cap layer 80: Ru layer, thickness of 5 nm In order to improve the flatness of the surface of the substrate 10, the substrate 10 was heated at 600° C. and left for 30 minutes, and then cooled to room temperature. Next, the second underlayer 22 (Cr layer) was formed on the substrate 10 by a sputtering method. Next, the third underlayer 23 (Ag layer) was formed on the second underlayer 22 by a sputtering method to form the underlayer 20. The substrate 10 on which the underlayer 20 was formed was heated at 300° C. for 15 minutes and then cooled to room temperature.

After cooling, the first insertion layer 91 (Ni layer) was formed on the underlayer 20 formed on the substrate 10. The first insertion layer 91 was formed by a sputtering method.

The substrate-side first ferromagnetic layer 30B ($Co_2Fe_{1.03}Ga_{0.41}Ge_{0.86}$ layer) having a thickness of 7 nm was formed on the first insertion layer 91. The substrate-side first ferromagnetic layer 30B was formed by a co-sputtering method using a $Co_2Fe_1Ga_{0.5}Ge_{0.5}$ alloy target and a Ge target as targets.

The non-magnetic layer-side first ferromagnetic layer 30A ($Co_2Fe_{1.13}Ga_{0.41}Ge_{0.76}$ layer) having a thickness of 3 nm was formed on the substrate-side first ferromagnetic layer 30B. The non-magnetic layer-side first ferromagnetic layer 30A was formed by a co-sputtering method using a $Co_2Fe_1Ga_{0.5}Ge_{0.5}$ alloy target, a Ge target, and an Fe target as targets.

The substrate 10 on which the first ferromagnetic layer 30 including the substrate-side first ferromagnetic layer 30B and the non-magnetic layer-side first ferromagnetic layer 30A were formed was heated at 600° C. for 15 minutes, and then cooled to room temperature.

The first NiAl layer 40 was formed on the first ferromagnetic layer 30 by a sputtering method. The first NiAl layer 40 was formed by a co-sputtering method using a $Ni_{50}Al_{50}$ alloy target and an Al target as targets. In this case, the main composition of the first NiAl layer 40 was Al.

Next, the non-magnetic layer 50 (Ag layer) was formed on the first NiAl layer 40 by a sputtering method.

Next, the second NiAl layer 60 was formed on the non-magnetic layer 50 by a sputtering method. The second NiAl layer 60 was formed by a co-sputtering method using a $Ni_{50}Al_{50}$ alloy target and a Ni target as targets. In this case, the main composition of the second NiAl layer 60 was Ni.

Then, the non-magnetic layer-side second ferromagnetic layer 70A ($Co_2Fe_{1.03}Ga_{0.41}Ge_{0.86}$ layer) having a thickness of 4 nm was formed on the second NiAl layer 60. The non-magnetic layer-side second ferromagnetic layer 70A was formed by a co-sputtering method using a $Co_2Fe_1Ga_{0.5}Ge_{0.5}$ alloy target and a Ge target as targets. Then, the substrate 10 on which the non-magnetic layer-side second ferromagnetic layer 70A was formed was heated at 500° C. for 15 minutes, and then cooled to room temperature.

The cap layer-side second ferromagnetic layer 70B ($Co_2Fe_{1.03}Ga_{0.41}Ge_{0.86}$ layer) having a thickness of 4 nm was formed on the non-magnetic layer-side second ferromagnetic layer 70A. The cap layer-side second ferromagnetic layer 70B was formed by a co-sputtering method using a $Co_2Fe_1Ga_{0.5}Ge_{0.5}$ alloy target and a Ge target as targets. Then, the substrate 10 on which the cap layer-side second ferromagnetic layer 70B was formed was heated at 450° C. for 15 minutes and then cooled to room temperature.

After cooling, the second insertion layer 92 (Ni layer) was formed on the second ferromagnetic layer 70 formed on the substrate 10. The second insertion layer 92 was formed by a sputtering method. Finally, the cap layer 80 (Ru layer) was formed on the second insertion layer 92 (Ni layer) by a sputtering method. Thus, the magnetoresistance effect element 104 shown in FIG. 13 was produced.

Figure 14:
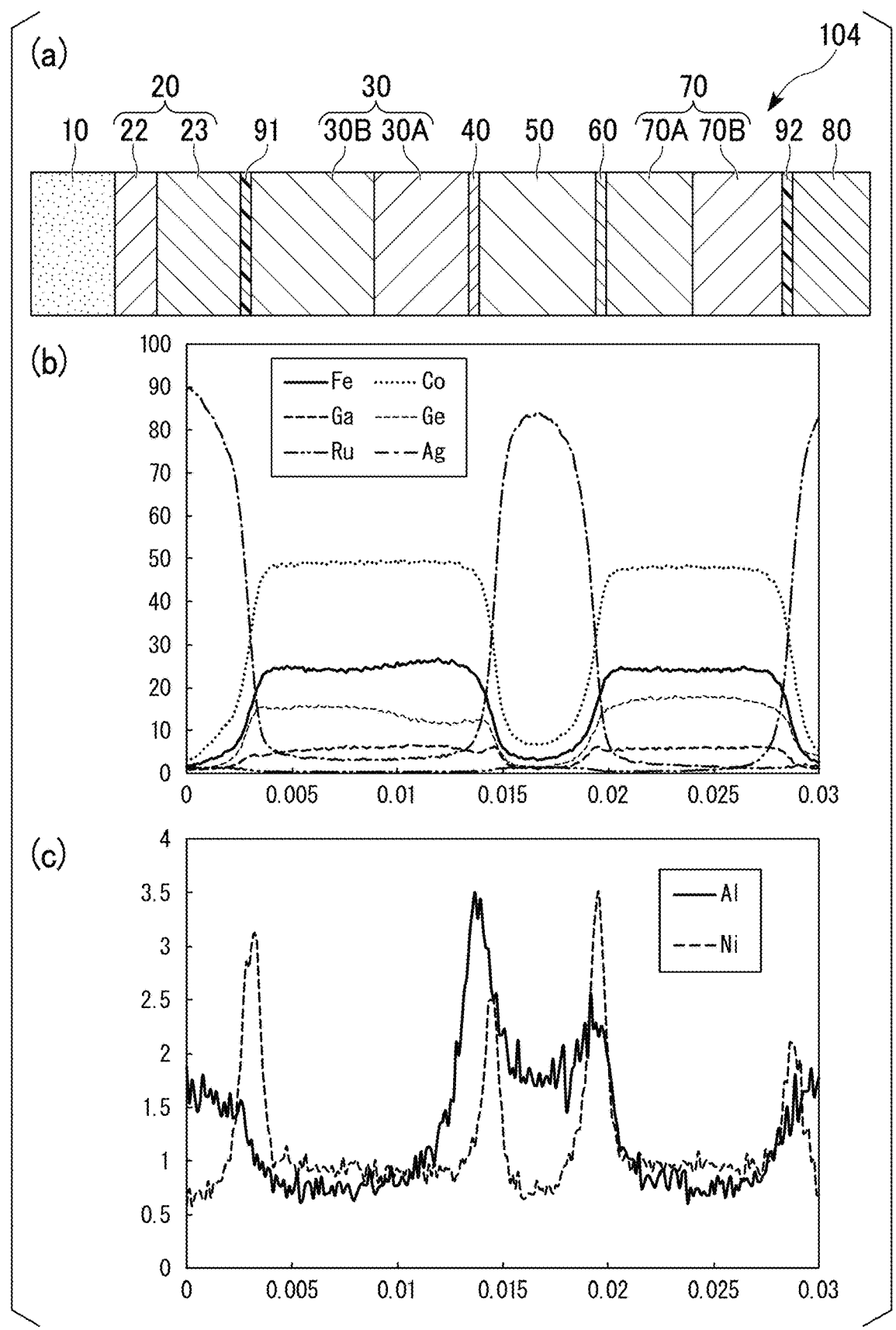
FIG. 14 shows cross-sectional views of a magnetoresistance effect element produced in Example 7 and an element distribution diagram of a cut surface of the magnetoresistance effect element cut in the lamination direction.

The obtained magnetoresistance effect element 104 was filled with a resin, the magnetoresistance effect element 104 was cut in the lamination direction, and the cut surface was polished. Elements Fe, Co, Ga, Ge, Ru, Ag, Ni, and Al were mapped on the cut surface of respective layers from the third underlayer 23 to the cap layer 80 using an energy dispersive X-ray spectrometer (EDS). FIG. 14 shows distribution diagrams of the elements. FIG. 14(a) shows a cross-sectional view of the magnetoresistance effect element 104, FIG. 14(b) shows a distribution diagram of Fe, Co, Ga, Ge, Ru, and Ag on the cut surface of the magnetoresistance effect element 104, and FIG. 14(c) shows a distribution diagram of Ni and Al on the cut surface of the magnetoresistance effect element 104. In the distribution diagrams of FIGS. 14(b) and 14(c), the horizontal axis represents a distance in the lamination direction using a point on the third underlayer 23 as a starting point 0. The vertical axis represents atom %. Based on the distribution diagram of elements in FIG. 14, it was confirmed that, from the third underlayer 23 toward the cap layer 80, the layer containing Ag (the third underlayer 23), the layer containing Ni (the first insertion layer 91), the layer containing Co, Fe, Ga, and Ge (the first ferromagnetic layer 30), the NiAl layer containing a larger amount of Al than that of Ni (the first NiAl layer 40), the layer containing Ag (the non-magnetic layer 50), the NiAl layer containing a larger amount of Ni than that of Al (the second NiAl layer 60), the layer containing Co, Fe, Ga, and Ge (the second ferromagnetic layer 70), the layer containing Ni (the second insertion layer 92), and the layer containing Ru (the cap layer 80) were formed. In addition, it was confirmed that the non-magnetic layer-side first ferromagnetic layer 30A of the first ferromagnetic layer 30 had a lower Ge concentration and a higher Fe concentration than the substrate-side first ferromagnetic layer 30B. In addition, a tendency of the non-magnetic layer-side first ferromagnetic layer 30A of the first ferromagnetic layer 30 to have a higher Ga concentration near the non-magnetic layer 50 was observed. In addition, a tendency of the non-magnetic layer-side second ferromagnetic layer 70A of the second ferromagnetic layer 70 to have a higher Ga concentration near the non-magnetic layer 50 was observed.

Figure 15A:
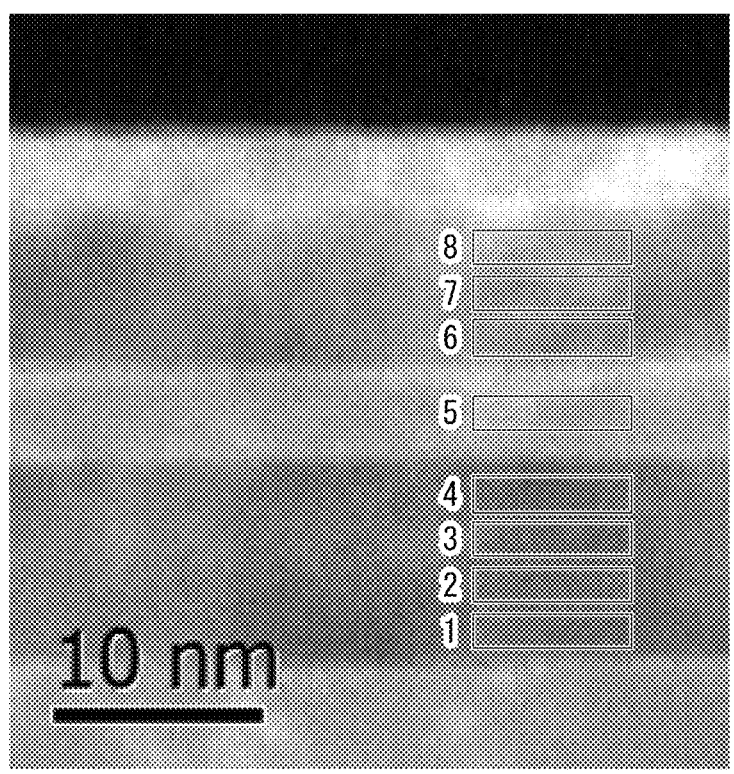
FIG. 15A shows an STEM image of a cut surface of the magnetoresistance effect element produced in Example 7 cut in the lamination direction.
Figure 15B:
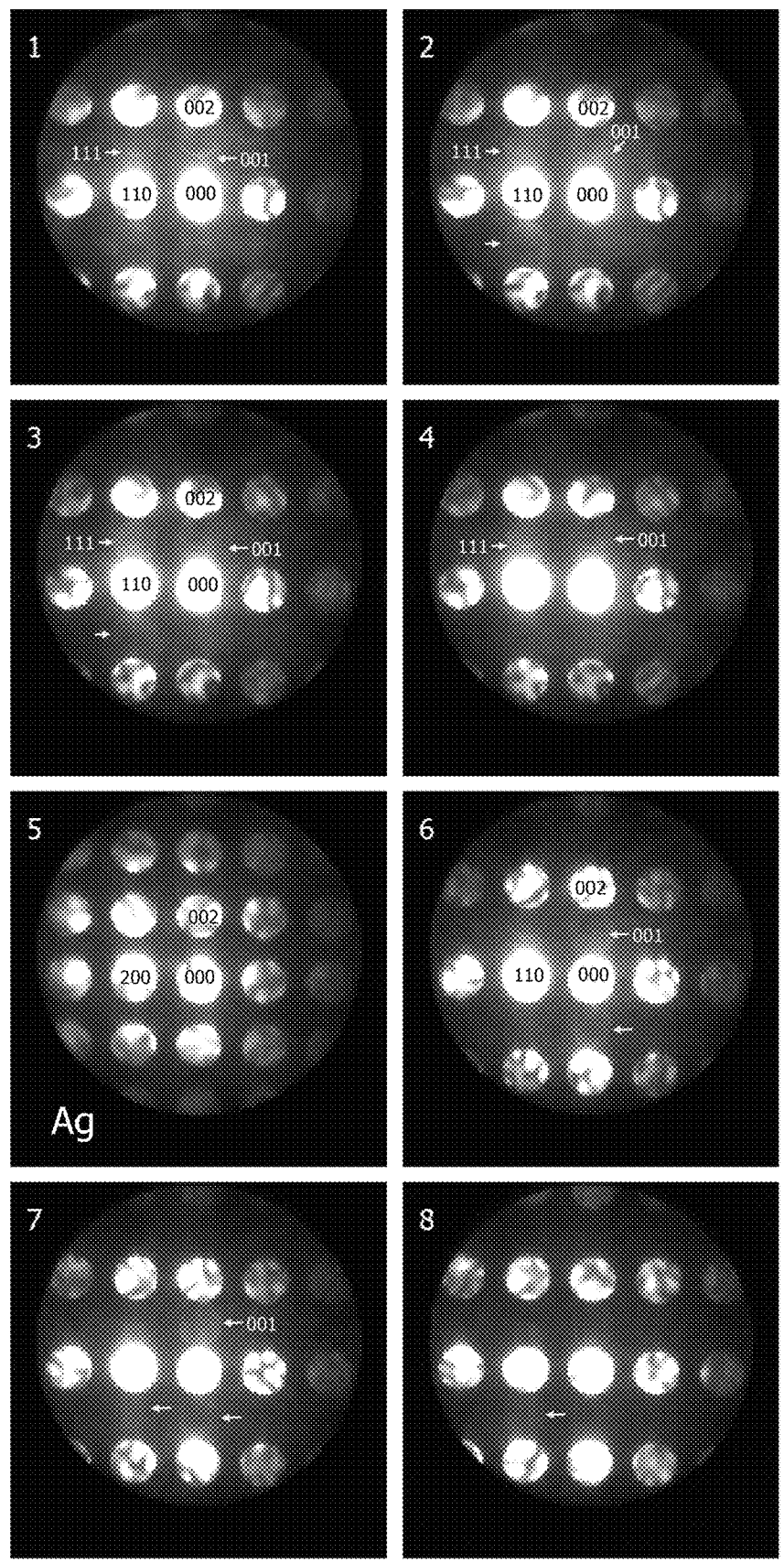
FIG. 15B shows electron beam diffraction images of areas shown in 1 to 8 in a TEM image in FIG. 15A.

In addition, the cut surface of the magnetoresistance effect element 104 filled with a resin was observed using an annular dark field-scanning transmission electron microscope (ADF-STEM) method, an electron beam diffraction image of a small area of the cut surface was obtained using a convergent-beam electron diffraction (CBED) method, and the crystal structure was identified. The results are shown in FIG. 15A and FIG. 15B. FIG. 15A shows a STEM image of the cut surface of the magnetoresistance effect element, and FIG. 15B shows electron beam diffraction images of areas 1 to 8 in the TEM image in FIG. 15A. The areas 1 to 4 were areas in the first ferromagnetic layer 30, the area 5 was an area in the non-magnetic layer 50, and the areas 6 to 8 were areas in the second ferromagnetic layer 70. As a result, diffraction spots from the (001) plane derived from the B2 structure was confirmed in the first ferromagnetic layer 30 and the second ferromagnetic layer 70. That is, it was confirmed that the crystal structure had a regularity including the B2 structure (CsCl structure). In addition, in the substrate-side first ferromagnetic layer 30B and the non-magnetic layer-side first ferromagnetic layer 30A of the first ferromagnetic layer 30, in addition to diffraction spots from the (001) plane derived from the B2 structure, diffraction spots from the (111) plane derived from the L21 structure having a higher regularity than the B2 structure were confirmed. That is, it was confirmed that the crystal structure had a regularity including the L21 structure.

EXPLANATION OF REFERENCES 101, 102, 103, 104 Magnetoresistance effect element
10 Substrate
20 Underlayer
21 First underlayer
22 Second underlayer
23 Third underlayer
24 Fourth underlayer
30 First ferromagnetic layer
30A Non-magnetic layer-side first ferromagnetic layer
30B Substrate-side first ferromagnetic layer
40 First NiAl layer
50 Non-magnetic layer
60 Second NiAl layer
70 Second ferromagnetic layer
70A Non-magnetic layer-side second ferromagnetic layer
70B Cap layer-side second ferromagnetic layer
80 Cap layer
91 First insertion layer
92 Second insertion layer
201 Magnetic recording device
202, 203 Magnetic recording element
210 Magnetic head
220 Resistance-measuring device
230 Power supply
240 Measurement unit
300 Spin current magnetization rotating element
400 Magnetic domain wall-moving type magnetic recording element
401 First ferromagnetic layer
402 Second ferromagnetic layer
403 Non-magnetic layer
404 First magnetization fixed layer
405 Second magnetization fixed layer
500 Magnetic thin wire device
510 Magnetic recording medium
511 Magnetic thin wire
511A First magnetic domain
511B Second magnetic domain
512 Underlayer
513 Substrate 520 Magnetic recording head
530 Pulse power supply
600 Magnetic domain wall-moving type spatial optical modulator
610 First magnetization fixed layer
620 Second magnetization fixed layer
630 Light modulation layer
631, 636 Overlapping area
632, 635 Initial magnetic domain area
633, 634 Magnetic domain change area
DW Magnetic domain wall

What is claimed is:

1. A magnetoresistance effect element including a first ferromagnetic layer, a second ferromagnetic layer, and a non-magnetic layer positioned between the first ferromagnetic layer and the second ferromagnetic layer,
wherein at least one of the first ferromagnetic layer and the second ferromagnetic layer contains a Heusler alloy represented by the following General Formula (1):

$$Co_2Fe_\alpha X_\beta \qquad (1)$$

(in Formula (1), X represents one or more elements selected from the group consisting of Mn, Cr, Si, Al, Ga and Ge, and α and β represent numbers that satisfy 2.3≤α+β and 0.5<α<1.9).

2. The magnetoresistance effect element according to claim 1,
wherein the Heusler alloy is an alloy represented by the following General Formula (2):

$$Co_2Fe_\alpha Ga_\gamma Y_{\beta-\gamma} \qquad (2)$$

(in Formula (2), Y represents one or more elements selected from the group consisting of Mn, Cr, Si, Al and Ge, and α, β and γ represent numbers that satisfy 2.3≤α+β, 0.5<α<1.9, and 0.1≤γ).

3. The magnetoresistance effect element according to claim 2,
wherein, in General Formula (2), β and γ represent numbers that satisfy 2×γ<β.

4. The magnetoresistance effect element according to claim 1,
wherein the Heusler alloy is an alloy represented by the following General Formula (3):

$$Co_2Fe_\alpha Ge_\delta Z_{\beta-\delta} \qquad (3)$$

(in Formula (3), Z represents one or more elements selected from the group consisting of Mn, Cr, Si, Al and Ga, and α, β and δ represent numbers that satisfy 2.3≤α+β, 0.5<α<1.9, and 0.1≤δ).

5. The magnetoresistance effect element according to claim 4,
wherein, in General Formula (3), β and δ represent numbers that satisfy 2×δ>β.

6. The magnetoresistance effect element according to claim 1,
wherein the Heusler alloy is an alloy represented by the following General Formula (4):

$$Co_2Fe_\alpha Ga_\gamma Ge_\delta \qquad (4)$$

(in Formula (4), α, γ and δ represent numbers that satisfy 2.3≤α+γ+δ, 0.5<α<1.9, 0.1≤γ, and 0.1≤δ).

7. The magnetoresistance effect element according to claim 6,
wherein, in General Formula (4), γ and δ represent numbers that satisfy γ<δ.

8. The magnetoresistance effect element according to claim 6,
wherein, in General Formula (4), α, γ and δ represent numbers that satisfy 2.3≤α+γ+δ<2.66.

9. The magnetoresistance effect element according to claim 8,
wherein, in General Formula (4), α, γ and δ represent numbers that satisfy 2.45<α+γ+δ<2.66.

10. The magnetoresistance effect element according to claim 6,
wherein, in General Formula (4), δ represents a number that satisfies 0.63<δ<1.26.

11. The magnetoresistance effect element according to claim 10,
wherein, in General Formula (4), δ represents a number that satisfies 0.84<δ<1.26.

12. The magnetoresistance effect element according to claim 1,
wherein the Heusler alloy is an alloy represented by the following General Formula (5):

$$Co_2Fe_\alpha Ga_\gamma Ge_\delta Mn_\epsilon \qquad (5)$$

(in Formula (5), α, γ, δ and ε represent numbers that satisfy 2.3≤α+γ+δ+ε, 0.5<α<1.9, 0.1≤γ, 0.1≤δ, and 0.1≤ε).

13. The magnetoresistance effect element according to claim 12,
wherein, in General Formula (5), δ and ε represent numbers that satisfy δ<ε.

14. The magnetoresistance effect element according to claim 12,
wherein, in General Formula (5), ε represents a number that satisfies 0.38<ε<0.76.

15. The magnetoresistance effect element according to claim 1,
wherein the non-magnetic layer contains Ag.

16. The magnetoresistance effect element according to claim 1,
wherein a NiAl layer containing a NiAl alloy is provided between the first ferromagnetic layer and the non-magnetic layer and between the second ferromagnetic layer and the non-magnetic layer.

17. The magnetoresistance effect element according to claim 16,
wherein the thickness t of the NiAl layer satisfies 0<t≤0.63 nm.

18. The magnetoresistance effect element according to claim 16,
wherein the NiAl alloy contains a larger amount of Ni than of Al.

19. The magnetoresistance effect element according to claim 16,
wherein the NiAl alloy contains a larger amount of Al than of Ni.

20. The magnetoresistance effect element according to claim 1,
wherein at least one of the first ferromagnetic layer and the second ferromagnetic layer is a laminate including two or more ferromagnetic layers, and the ferromagnetic layer in contact with the non-magnetic layer among the two or more ferromagnetic layers has a higher Fe concentration than the ferromagnetic layer on the side opposite to the non-magnetic layer.

21. The magnetoresistance effect element according to claim 1,
wherein at least one of the first ferromagnetic layer and the second ferromagnetic layer is a laminate including two or more ferromagnetic layers, the two or more ferromagnetic layers each contains Ge, and the ferromagnetic layer in contact with the non-magnetic layer among the two or more ferromagnetic layers has a lower Ge concentration than the ferromagnetic layer on the side opposite to the non-magnetic layer.

22. The magnetoresistance effect element according to claim 1,
wherein at least one of the first ferromagnetic layer and the second ferromagnetic layer is a laminate including two or more ferromagnetic layers, the two or more ferromagnetic layers each contains Ga, and the ferromagnetic layer in contact with the non-magnetic layer among the two or more ferromagnetic layers has a higher Ga concentration than the ferromagnetic layer on the side opposite to the non-magnetic layer.

23. The magnetoresistance effect element according to claim 1,
wherein at least one of the first ferromagnetic layer and the second ferromagnetic layer is a laminate including two or more ferromagnetic layers, and the ferromagnetic layer in contact with the non-magnetic layer among the two or more ferromagnetic layers has a higher regularity than the ferromagnetic layer on the side opposite to the non-magnetic layer.

24. The magnetoresistance effect element according to claim 1,
wherein, on at least one of the first ferromagnetic layer and the second ferromagnetic layer, a layer containing Ni is provided on the side opposite to the non-magnetic layer.

25. A Heusler alloy represented by the following General Formula (1):

$$Co_2Fe_\alpha X_\beta \quad (1)$$

(in Formula (1), X represents one or more elements selected from the group consisting of Mn, Cr, Si, Al, Ga and Ge, and $\alpha$ and $\beta$ represent numbers that satisfy $2.3 \leq \alpha+\beta$, and $0.5 < \alpha < 1.9$).

* * * * *